(12) United States Patent
Kim et al.

(10) Patent No.: US 9,831,439 B2
(45) Date of Patent: Nov. 28, 2017

(54) ORGANIC LIGHT-EMITTING DEVICE

(71) Applicant: SAMSUNG DISPLAY CO., LTD., Yongin, Gyeonggi-Do (KR)

(72) Inventors: Myeong-Suk Kim, Yongin (KR); Ji-Hyun Seo, Yongin (KR); Sung-Wook Kim, Yongin (KR); Jae-Hong Kim, Yongin (KR); Jin-Soo Hwang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 592 days.

(21) Appl. No.: 14/288,288

(22) Filed: May 27, 2014

(65) Prior Publication Data
US 2015/0171335 A1    Jun. 18, 2015

(30) Foreign Application Priority Data

Dec. 12, 2013   (KR) .......................... 10-2013-0154836

(51) Int. Cl.
*H01L 51/00* (2006.01)
*H01L 51/50* (2006.01)

(52) U.S. Cl.
CPC ...... *H01L 51/0058* (2013.01); *H01L 51/0067* (2013.01); *H01L 51/0072* (2013.01);
(Continued)

(58) Field of Classification Search
None
See application file for complete search history.

(56) References Cited

U.S. PATENT DOCUMENTS

| | | |
|---|---|---|
| 2008/0014464 A1 | 1/2008 | Kawamura et al. |
| 2008/0108832 A1 | 5/2008 | Yabunouchi et al. |

(Continued)

FOREIGN PATENT DOCUMENTS

| | | |
|---|---|---|
| KR | 10-2009-0008369 A | 1/2009 |
| KR | 10-2009-0021174 A | 2/2009 |

(Continued)

*Primary Examiner* — Gregory Clark
(74) *Attorney, Agent, or Firm* — Lewis Roca Rothgerber Christie LLP

(57) ABSTRACT

According to an embodiment of the present invention, an organic light-emitting device includes: a first electrode; a second electrode facing the first electrode; and an emission layer between the first electrode and the second electrode. The organic light-emitting device includes a hole transport zone between the first electrode and the emission layer and includes an auxiliary layer, wherein the auxiliary layer includes at least one auxiliary material represented by Formula 1 below, and wherein the emission layer includes at least one light-emitting material represented by Formula 2 below.

Formula 1

(Continued)

-continued

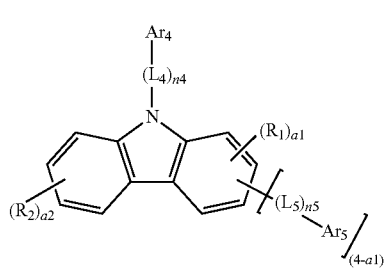

Formula 2

19 Claims, 1 Drawing Sheet

(52) U.S. Cl.
CPC ........ *H01L 51/006* (2013.01); *H01L 51/0052* (2013.01); *H01L 51/0061* (2013.01); *H01L 51/0073* (2013.01); *H01L 51/0074* (2013.01); *H01L 51/0085* (2013.01); *H01L 51/5016* (2013.01); *H01L 51/5064* (2013.01); *H01L 51/5096* (2013.01); *H01L 2251/308* (2013.01); *H01L 2251/552* (2013.01)

(56) References Cited

U.S. PATENT DOCUMENTS

| 2009/0302758 | A1 | 12/2009 | Saitoh et al. |
| 2012/0205642 | A1* | 8/2012 | Yokoyama ........... C07D 209/86 257/40 |
| 2012/0235123 | A1 | 9/2012 | Lee et al. |

FOREIGN PATENT DOCUMENTS

| KR | 10-2009-0036139 A | 4/2009 | |
| KR | 10-2011-0015836 A | 2/2011 | |
| KR | 10-125145 B1 | 4/2013 | |
| WO | WO 2011/122381 | * 10/2011 | ............. C09K 11/06 |

* cited by examiner

ORGANIC LIGHT-EMITTING DEVICE

CROSS-REFERENCE TO RELATED APPLICATION

This application claims priority to and the benefit of Korean Patent Application No. 10-2013-0154836, filed on Dec. 12, 2013, in the Korean Intellectual Property Office, the disclosure of which is incorporated herein in its entirety by reference.

BACKGROUND

1. Field

One or more embodiments of the present invention relate to an organic light-emitting device.

2. Description of the Related Art

Organic light emitting devices are self-emission devices that have characteristics including wide viewing angles, a high contrast ratio, short response times, and excellent brightness, driving voltage, and response speed, and produce full-color images.

An organic light-emitting device may include a first electrode disposed on a substrate, and include a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light.

SUMMARY

An aspect according to one or more embodiments of the present invention is directed toward a novel organic light-emitting device.

According to an embodiment of the present invention, an organic light-emitting device includes: a first electrode; a second electrode facing the first electrode; and an emission layer between the first electrode and the second electrode. The organic light-emitting device includes a hole transport zone between the first electrode and the emission layer and includes an auxiliary layer, wherein the auxiliary layer includes at least one auxiliary material represented by Formula 1 below, and wherein the emission layer includes at least one light-emitting material represented by Formula 2 below:

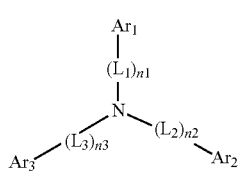

Formula 1

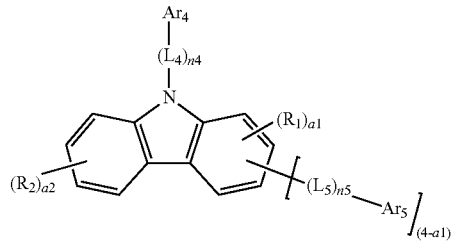

Formula 2 wherein, in Formulae 1 and 2, $Ar_1$ to $Ar_5$ are each independently selected from i) a $C_6$-$C_{60}$ aryl group and a $C_1$-$C_{60}$ heteroaryl group; and ii) a $C_6$-$C_{60}$ aryl group and a $C_1$-$C_{60}$ heteroaryl group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

$L_1$ to $L_5$ are each independently selected from i) a $C_6$-$C_{60}$ arylene group and a $C_1$-$C_{60}$ heteroarylene group; and ii) a $C_6$-$C_{60}$ arylene group and a $C_1$-$C_{60}$ heteroarylene group, each substituted with at least one substituent selected from a deuterium, a —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

n1 to n5 are each independently an integer of 0 to 3, and when n1 is 2 or greater, a plurality of $L_1$s are identical to or different from each other, when n2 is 2 or greater, a plurality of $L_2$s are identical to or different from each other, when n3 is 2 or greater, a plurality of $L_3$s are identical to or different from each other, when n4 is 2 or greater, a plurality of $L_4$s are identical to or different from each other, and when n5 is 2 or greater, a plurality of $L_5$s are identical to or different from each other;

$R_1$ and $R_2$ are each independently selected from a hydrogen, a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group; and a1 and a2 are each independently an integer of 0 to 4, and when a1 is 2 or greater, a plurality of $R_1$s are identical to or different from each other, and when a2 is 2 or greater, a plurality of $R_2$s are identical to or different from each other.

According to another embodiment of the present invention, an organic light-emitting device includes a first electrode; a second electrode facing the first electrode; and an emission layer between the first electrode and the second electrode; wherein the organic light-emitting device includes a hole transport zone between the first electrode and the emission layer and includes an auxiliary layer, wherein the auxiliary layer includes at least one auxiliary material having a highest occupied molecular orbital (HOMO) energy level (EH) defined by $5.4\ eV \le |EH| \le 6.1\ eV$ and a triplet energy level ($ET_a$) defined by $|ET_a| \ge 0.2.4\ eV$, and wherein the emission layer includes at least one light-emitting material having a triplet energy level ($ET_e$) defined by $|ET_e| \ge 2.3\ eV$.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
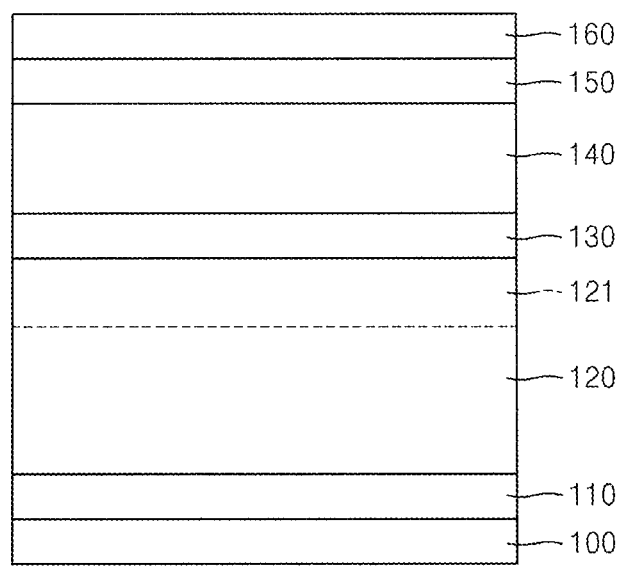
FIG. 1 is a schematic view of a structure of an organic light-emitting device according to an embodiment of the present invention.
Figure 2:
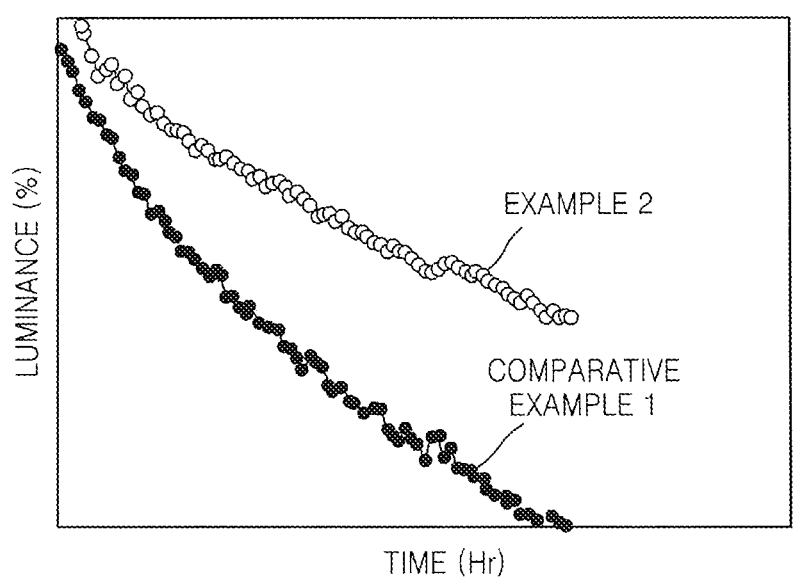
FIG. 2 is a graph showing luminance of the organic light-emitting devices prepared according to Example 2 and Comparative Example 1 of the present invention.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

The expression that "(an organic layer) includes at least one selected from compounds represented by Formula 1" used herein refers to that "(an organic layer) includes one kind of compounds represented by Formula 1, or two or more different kinds of compounds represented by Formula 1".

The term "organic layer" used herein refers to a single layer and/or a plurality of layers disposed between a first electrode and a second electrode.

FIG. 1 is a cross-sectional view schematically illustrating an organic light-emitting device 1 according to an embodiment of the present invention. Hereinafter, the structure of an organic light-emitting device according to an embodiment of the present invention and a method of manufacturing an organic light-emitting device according to an embodiment of the present invention will be described in connection with FIG. 1.

The organic light-emitting device 1 includes a substrate 100, a first electrode 110, a hole transport zone 120, an emission layer 130, an electron transport layer 140, an electron injection layer 150, and a second electrode 160.

The substrate 110 may be any one of various suitable substrates that are used in an organic light-emitting device, and may be a glass substrate or a transparent plastic substrate, with excellent mechanical strength, thermal stability, transparency, surface smoothness, ease of handling, and water repellency.

The first electrode 110 may be formed by, for example, depositing or sputtering a material for forming a first electrode on the substrate 100. When the first electrode 110 is an anode, the material for the first electrode may be selected from materials with a high work function to make holes easily injected. The first electrode 110 may be a reflective electrode or a transmission electrode. The material for the first electrode may be a transparent and highly conductive material, and examples of such a material are indium tin oxide (ITO), indium zinc oxide (IZO), tin oxide ($SnO_2$), and zinc oxide (ZnO). In some embodiments, to form the first electrode 110 as a reflective electrode, magnesium (Mg), aluminum (Al), aluminum-lithium (Al—Li), calcium (Ca), magnesium-indium (Mg—In), or magnesium-silver (Mg—Ag) may be used (utilized).

The first electrode 110 may have a single-layered structure or a multi-layered structure including two or more layers. For example, the first electrode 110 may have a three-layered structure of ITO/Ag/ITO, but the structure of the first electrode 110 is not limited thereto.

An organic layer is disposed on the first electrode 110.

The organic layer may include a hole transport zone 120, an emission layer 130, an electron transport layer 140, and an electron injection layer 150. The hole transport zone 120 may include a hole injection layer, a hole transport layer, a buffer layer, and an auxiliary layer 121.

A hole injection layer (HIL) may be formed on the first electrode 110 by using (utilizing) various suitable methods, such as vacuum deposition, spin coating, casting, or a Langmuir-Blodgett (LB) method.

When the HIL is formed using (utilizing) vacuum deposition, the deposition conditions may vary according to a compound that is used (utilized) to form the HIL, and the desired structure and thermal properties of the HIL to be formed. For example, the deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the deposition conditions are not limited thereto.

When the HIL is formed using (utilizing) spin coating, the coating conditions may vary according to a compound that is used (utilized) to form the HIL, and the desired structure and thermal properties of the HIL to be formed. For example, the coating may be performed at a coating rate of about 2,000 rpm to about 5,000 rpm, and a temperature at which heat treatment is performed to remove a solvent after the coating may be in the range of about 80° C. to about 200° C. However, the coating conditions are not limited thereto.

A thickness of the HIL may be in a range of about 100 Å to about 10,000 Å, for example, about 100 Å to about 1,000 Å. In one embodiment, when the thickness of the HIL is within these ranges, satisfactory hole injecting characteristics are obtained without a substantial increase in driving voltage.

Next, a hole transport layer (HTL) may be formed on the HIL by using (utilizing) various suitable methods, such as vacuum deposition, spin coating, casting, or an LB method. When the HTL is formed using (utilizing) vacuum deposition or spin coating, the deposition and coating conditions may be similar to those applied to form the HIL, although the deposition and coating conditions may vary according to a material that is used (utilized) to form the HTL.

A thickness of the HTL may be in a range of about 50 Å to about 2,000 Å, for example, about 100 Å to about 1,500 Å. In one embodiment, when the thickness of the HTL is within these ranges, satisfactory hole transporting characteristics are obtained without a substantial increase in driving voltage.

A functional layer having both hole injection and hole transport capabilities (hereinafter, referred to as an "H-functional layer") may include at least one selected from materials used (utilized) to form an HIL and materials used (utilized) to form an HTL, and a thickness of the H-functional layer may be in a range of about 50 Å to about 10,000 Å, for example, about 100 Å to about 1,000 Å. In one embodiment, when the thickness of the H-functional layer is within these ranges, satisfactory hole injecting and transporting characteristics are obtained without a substantial increase in driving voltage.

The HIL may use a suitable hole injection material, and examples of such a suitable hole injection material are N,N'-diphenyl-N,N'-bis-[4-(phenyl-m-tolyl-amino)-phenyl]-biphenyl-4,4'-diamine (DNTPD), a phthalocyanine compound (such as copper phthalocyanine), 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonic acid (Pani/CSA), and polyaniline/poly(4-styrenesulfonate) (PANI/PSS), but are not limited thereto:

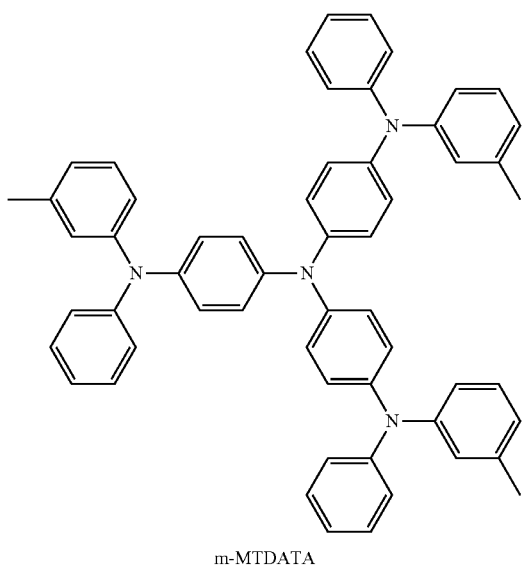

m-MTDATA

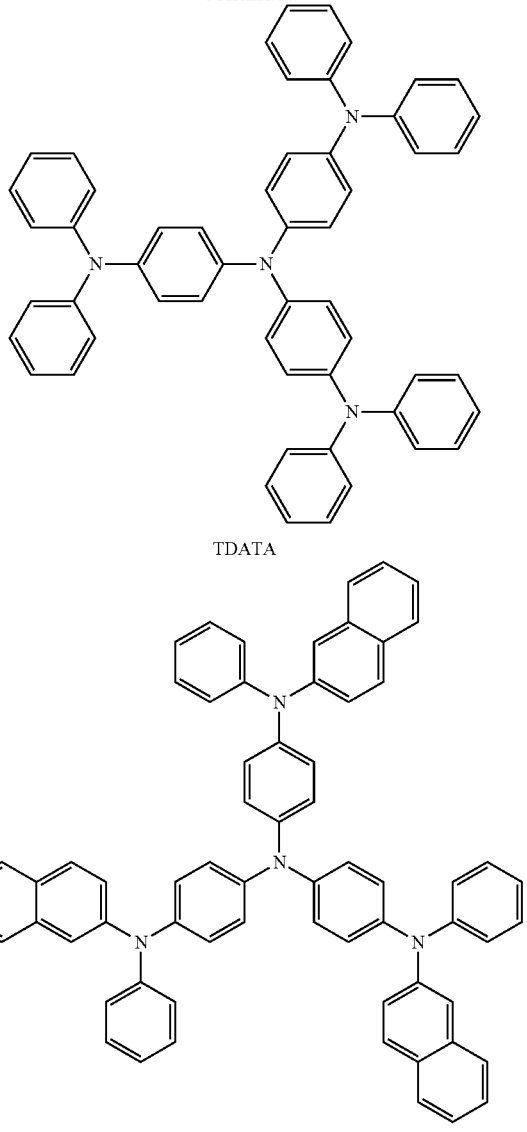

TDATA

2-TNATA

At least one layer of the HIL, the HTL, and the H-functional layer may further include, for example, a carbazole derivative (such as N-phenylcarbazole or polyvinylcarbazole), N,N'-bis(3-methylphenyl)-N,N'-diphenyl-[1,1-biphenyl]-4,4'-diamine (TPD), 4,4',4"-tris(N-carbazolyl)triphenylamine (TCTA), or N,N'-di(1-naphthyl)-N,N'-diphenylbenzidine (NPB), but the material is not limited thereto.

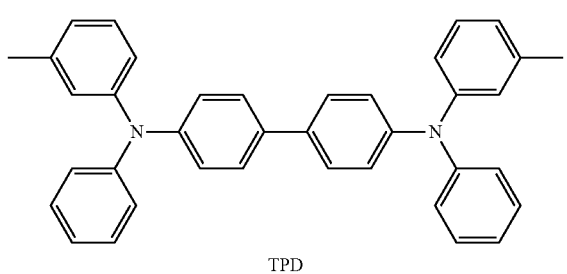

TPD

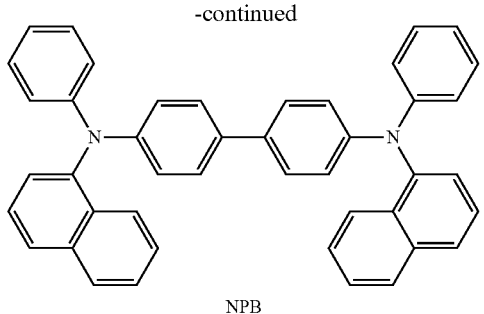

NPB

In addition, at least one layer of the HIL, the HTL, and the H-functional layer may include at least one of a compound represented by Formula 300 below and a compound represented by Formula 301 below:

Formula 300

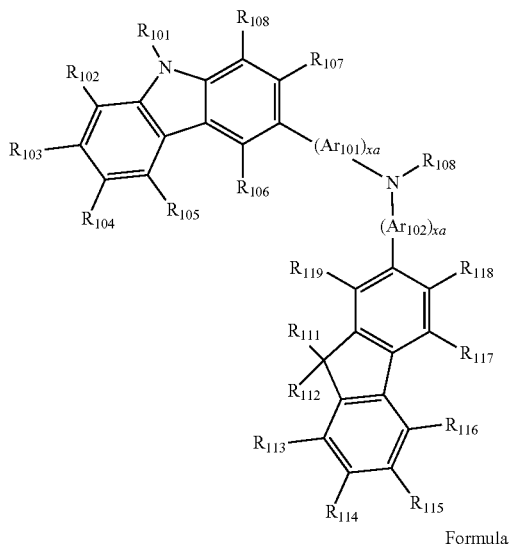

Formula 301

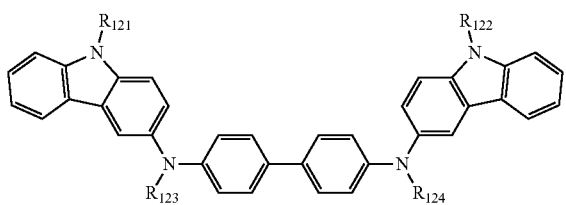

In Formula 300, $Ar_{101}$ and $Ar_{102}$ may be each independently selected from a substituted or unsubstituted $C_6$-$C_{60}$ arylene group. For example, $Ar_{101}$ and $Ar_{102}$ may be each independently a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, or a pentaphenylene group; or a phenylene group, a pentalenylene group, an indenylene group, a naphthylene group, an azulenylene group, a heptalenylene group, a substituted or acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, or a pentaphenylene group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group.

In Formula 300, xa and xb may be each independently an integer of 0 to 5, or may be 0, 1, or 2. For example, xa may be 1 and xb may be 0, but are not limited thereto.

In Formulae 300 and 301, $R_{101}$ to $R_{108}$, $R_{111}$ to $R_{119}$, and $R_{121}$ to $R_{124}$ may be each independently a hydrogen, a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group. For example, $R_{51}$ to $R_{58}$, $R_{61}$ to $R_{69}$, $R_{71}$, and $R_{72}$ may be each independently a hydrogen; a deuterium; a halogen atom; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (e.g., a methyl group, an ethyl group, a propyl group, a butyl group, a pentyl group, or a hexyl group); a $C_1$-$C_{10}$ alkoxy group (e.g., a methoxy group, an ethoxy group, a propoxy group, a butoxy group, or a pentoxy); a $C_1$-$C_{10}$ alkyl group or a $C_1$-$C_{10}$ alkoxy group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group a phenyl group, a naphthyl group, an anthryl group, a fluorenyl group, or a pyrenyl group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group, but are not limited thereto.

In Formula 300, $R_{109}$ may be a phenyl group; a naphthyl group; an anthryl group; a biphenyl group; a pyridinyl group; or a phenyl group, a naphthyl group, an anthryl group, a biphenyl group, or a pyridinyl group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to another embodiment of the present invention, the compound of Formula 300 may be represented by Formula 300A below, but is not limited thereto:

Formula 300A

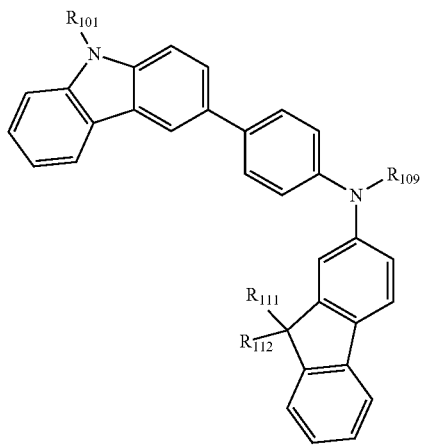

In Formula 300A, $R_{101}$, $R_{111}$, $R_{112}$, and $R_{109}$ may be defined as described above.

In some embodiments, at least one layer of the HIL, the HTL, and the H-functional layer may include at least one of compounds 301 to 320 below, but the compound is not limited thereto:

301

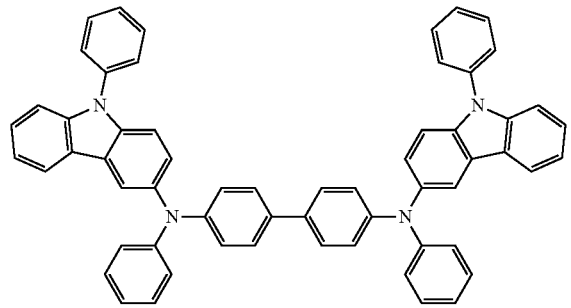

302

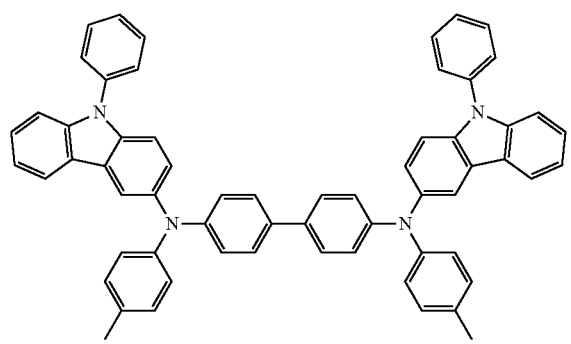

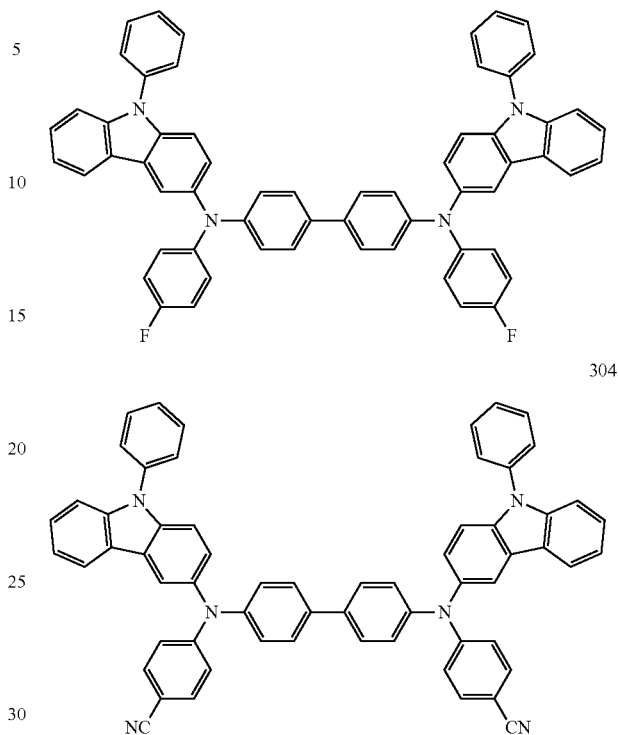

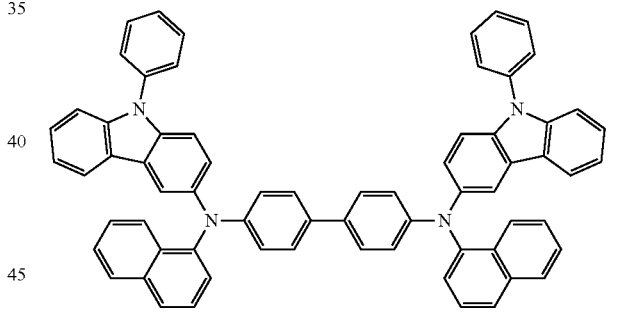

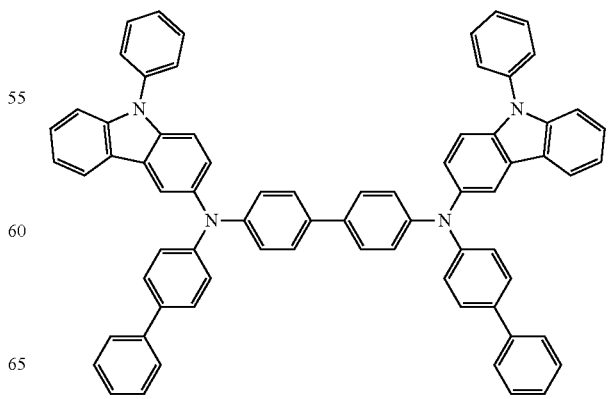

307
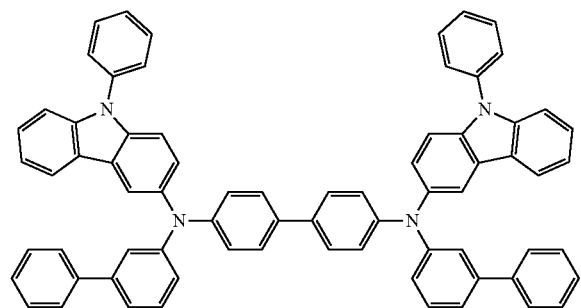
308
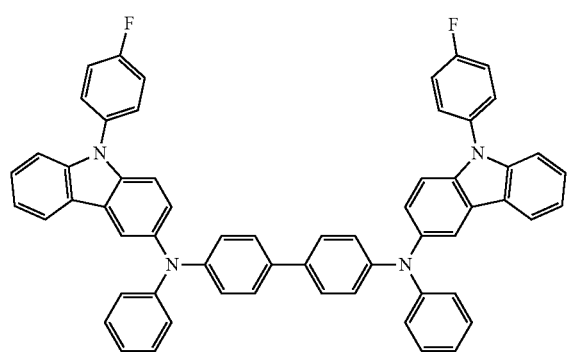
309
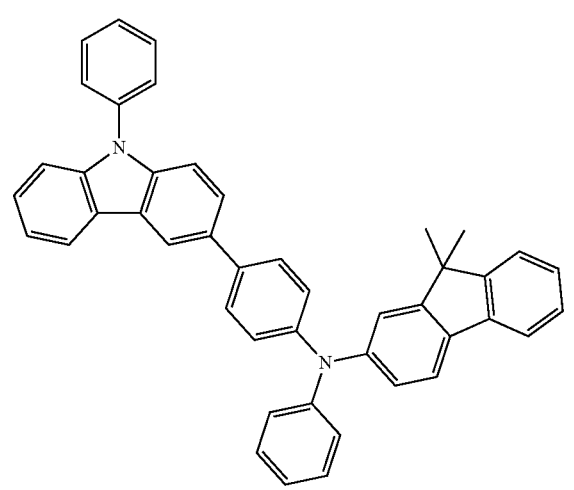
310
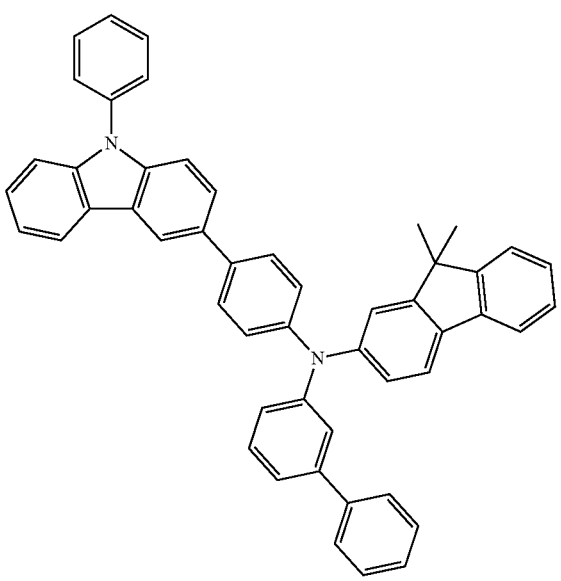
311
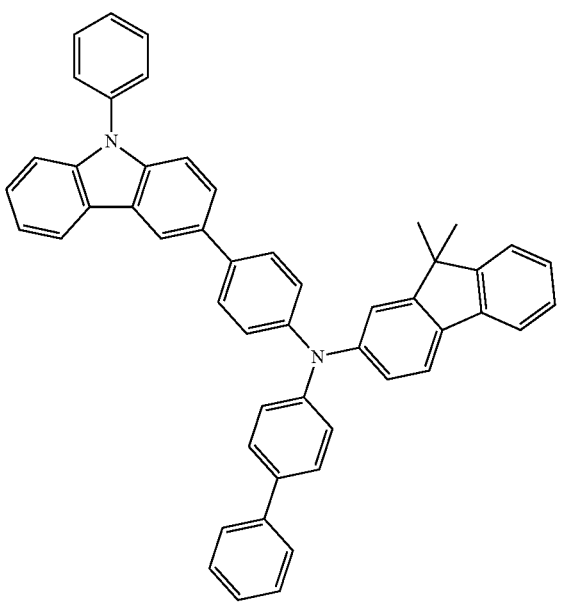

312
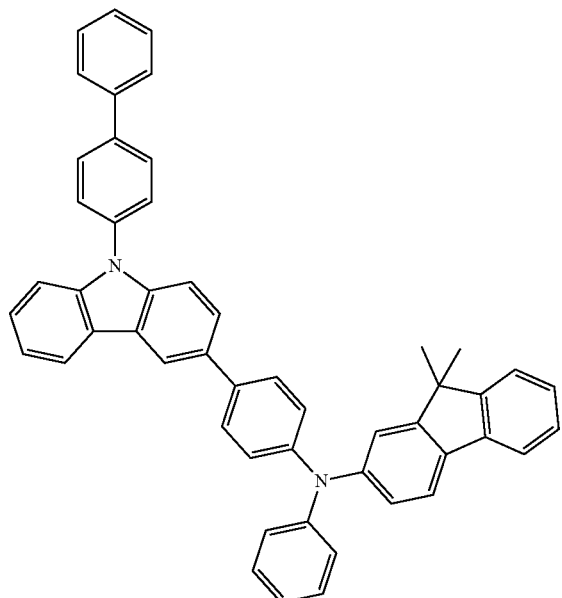
313
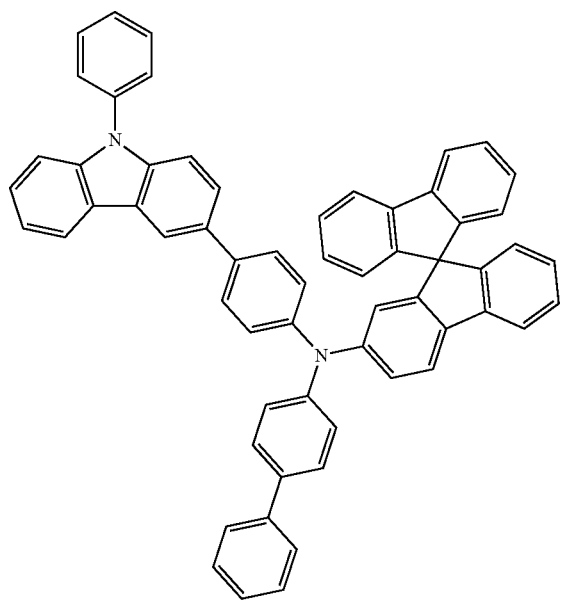
314
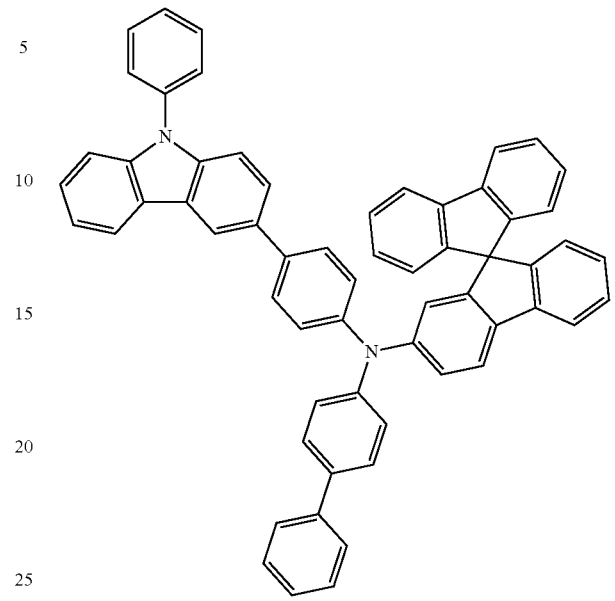
315
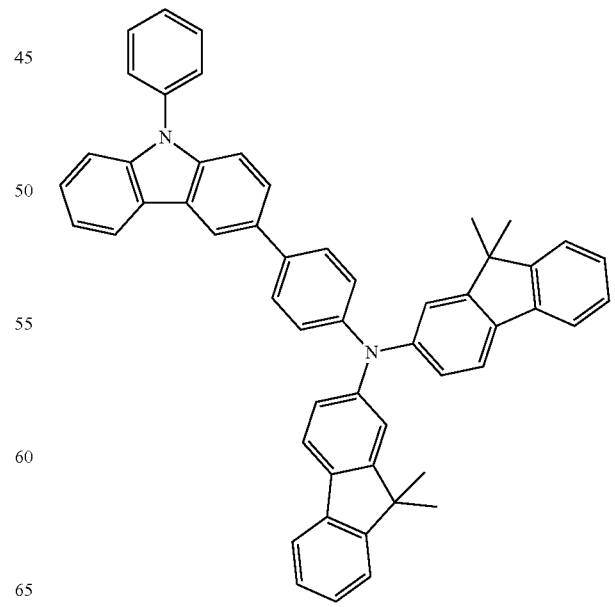

316
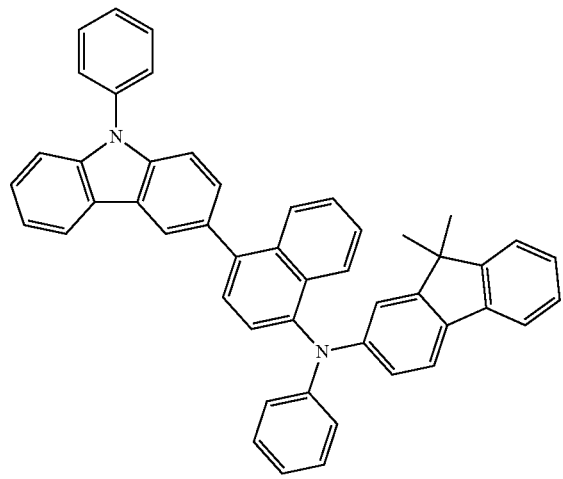
317
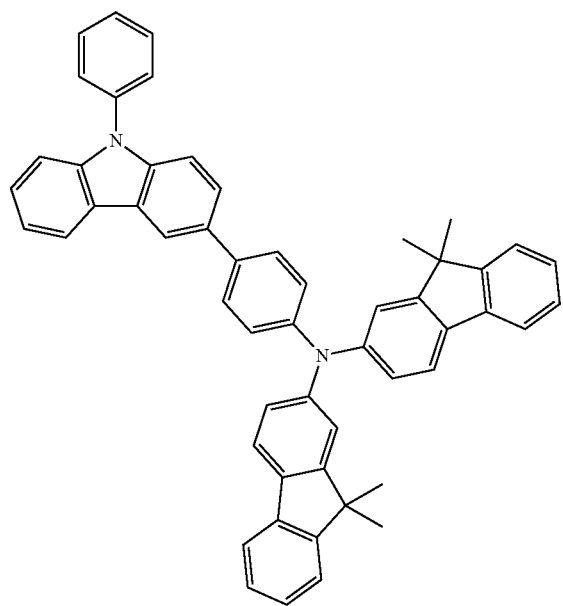
318
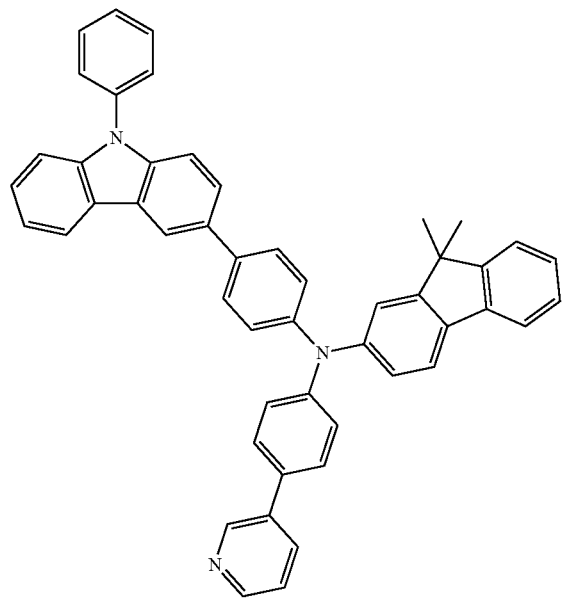
319
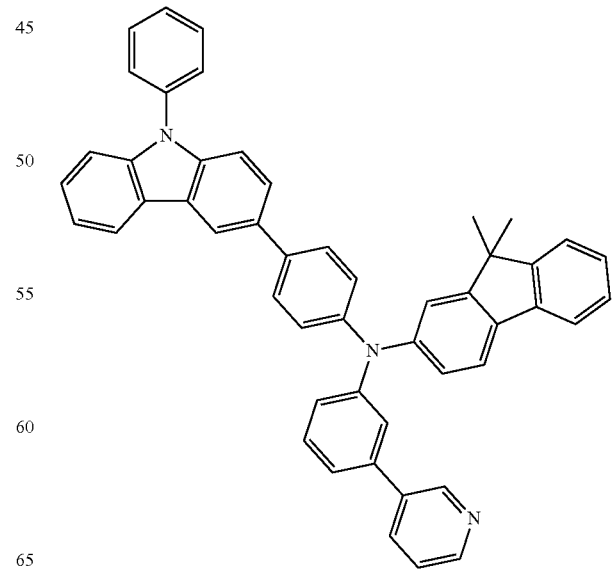

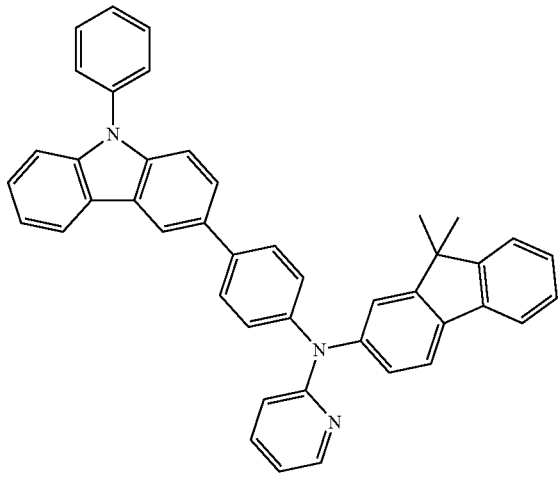

At least one layer of the HIL, the HTL, and the H-functional layer may further include a charge-generation material to improve conductivity of a film, in addition to the suitable materials used (utilized) to form the NIL, the HTL, and/or the H-functional layer as described above.

The charge-generation material may be, for example, a p-dopant. The p-dopant may be one of a quinone derivative, a metal oxide, and a cyano group-containing compound, but is not limited thereto. Non-limiting examples of the p-dopant include a quinone derivative (such as tetracyanoquinonedimethane (TCNQ) or 2,3,5,6-tetrafluoro-tetracyano-1,4-benzoquinonedimethane (F4-TCNQ)); a metal oxide (such as a tungsten oxide or a molybdenum oxide); and a cyano group-containing compound (such as Compound 200 below), but are not limited thereto.

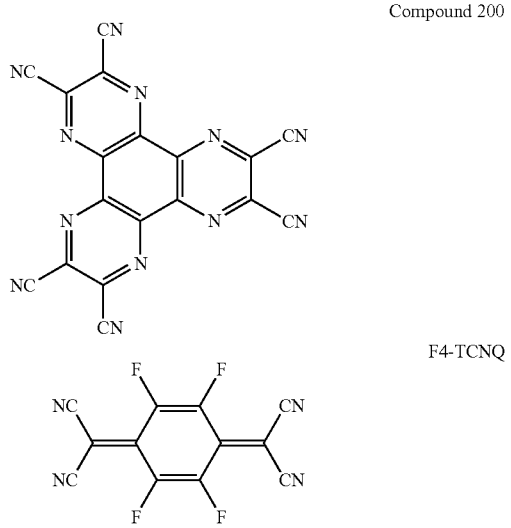

When the HIL, the HTL, or the H-functional layer further includes a charge-generation material, the charge-generation material may be homogeneously dispersed or non-homogeneously distributed in the HIL, the HTL, or the H-functional layer.

A buffer layer may be disposed between the emission layer and at least one layer of the HIL, the HTL, and the H-functional layer. The buffer layer may compensate for an optical resonance distance according to a wavelength of light emitted from the emission layer, and thus, efficiency of a formed organic light-emitting device may be improved. The buffer layer may include a suitable hole injection material and a suitable hole transport material. Also, the buffer layer may include a material that is identical to one of the materials included in the HIL, the HTL, and the H-functional layer formed under the buffer layer.

An auxiliary layer 121 may be disposed between the emission layer and at least one of the HIL, the HTL, the H-functional layer, and the buffer layer. The auxiliary layer 121 may speed up the transportation of holes to produce excitons at the emission layer and the interface between the emission layer and the auxiliary layer 121, thereby increasing the lifespan of the organic light-emitting diode. The auxiliary layer 121 may be formed by using (utilizing) various suitable methods, such as vacuum deposition, spin coating, casting, or an LB method. When the auxiliary layer 121 is formed using (utilizing) vacuum deposition or spin coating, the deposition and coating conditions may be similar to those applied to form the HIL, although the deposition and coating conditions may vary according to a material that is used (utilized) to form the auxiliary layer 121.

A thickness of the auxiliary layer 121 may be in a range of about 20 Å to about 1,000 Å, for example, about 100 Å to about 400 Å. In one embodiment, when the thickness of the auxiliary layer 121 is within these ranges, excellent hole blocking characteristics are obtained without a substantial increase in driving voltage.

The auxiliary layer 121 may include at least one selected from suitable auxiliary materials represented by Formula 1 below:

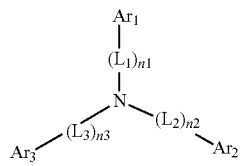

Formula 1

In Formula 1, $Ar_1$ to $Ar_3$ may be each independently selected from i) a $C_6$-$C_{60}$ aryl group and a $C_1$-$C_{60}$ heteroaryl group, and ii) a $C_6$-$C_{60}$ aryl group and a $C_1$-$C_{60}$ heteroaryl group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group.

In some embodiments, in Formula 1, $Ar_1$ to $Ar_3$ may be each independently selected from i) a phenyl group, a pentalenyl group, a naphthyl group, an azulenyl group, a heptalenyl group, an indacenyl group, a substituted acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzopuranyl group, and a dibenzothienyl group; and ii) a phenyl group, a pentalenyl group, a naphthyl group, an azulenyl group, a heptalenyl group, an indacenyl group, a substituted acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzopuranyl group, and a dibenzothienyl group, each substituted with at least one substituent selected from a deuterium, —F, —Cl, —Br, —I, a cyano group, a nitro group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group, but are not limited thereto.

In some other embodiments, in Formula 1, $Ar_1$ to $Ar_3$ may be each independently selected from i) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group;

ii) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a deuterium, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-buthoxy group;

iii) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group; and iv) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group, each substituted with at least one substituent selected from a deuterium, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-buthoxy group, but are not limited thereto.

In some other embodiments, in Formula 1, $Ar_1$ to $Ar_3$ may be each independently selected from i) a phenyl group, a naphthyl group, a fluorenyl group, a pyridinyl group, a pyrimidinyl group, a carbazolyl group, a furanyl group, a benzofuranyl group, a thienyl group, a benzothienyl group, a triazinyl group, a dibenzopuranyl group, and a dibenzothienyl group;

ii) a phenyl group, a naphthyl group, a fluorenyl group, a pyridinyl group, a pyrimidinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a biphenyl group, a naphthyl group, a pyridinyl group, a pyrimidinyl group, and a triazinyl group; and iii) a phenyl group, a naphthyl group, a fluorenyl group, a pyridinyl group, a pyrimidinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group, each substituted with at least one substituent selected from a deuterium, —F, a cyano group, a nitro group, a methyl group, a tert-butyl group, a methoxy group, and a tert-buthoxy group, but are not limited thereto.

In some other embodiments, in Formula 1, $Ar_1$ to $Ar_3$ may be each independently selected from i) a phenyl group, a naphthyl group, a fluorenyl group, a carbazolyl group, a dibenzopuranyl group, and a dibenzothienyl group; and ii) a phenyl group, a naphthyl group, a fluorenyl group, a carbazolyl group, a dibenzopuranyl group, and a dibenzothienyl group, each substituted with at least one substituent selected from a phenyl group, a biphenyl group, a naphthyl group, a pyridinyl group, a pyrimidinyl group, and a triazinyl group, but are not limited thereto.

In Formula 1, $L_1$ to $L_3$ may be each independently selected from i) a $C_6$-$C_{60}$ arylene group and a $C_1$-$C_{60}$ heteroarylene group, and ii) a $C_6$-$C_{60}$ arylene group and a $C_1$-$C_{60}$ heteroarylene group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group.

In some embodiments, in Formula 1, $L_1$ to $L_3$ may be each independently selected from i) a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene; and ii) a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group, but are not limited thereto.

In some other embodiments, in Formula 1, $L_1$ to $L_3$ may be each independently selected from i) a phenylene group, a naphthylene group, a fluorenylene group, a pyridinylene group, a pyrazinylene group, a pyrimidinylene group, a pyridazinylene group, a carbazolylene group, and a triazolylene group; and ii) a phenylene group, a naphthylene group, a fluorenylene group, a pyridinylene group, a pyrazinylene group, a pyrimidinylene group, a pyridazinylene group, a carbazolylene group, and a triazolylene group, each substituted with at least one substituent selected from a phenyl group, a naphthyl group, a pyridinyl group, a pyrimidinyl group, and a triazinyl group, but are not limited thereto.

In some other embodiments, in Formula 1, $L_1$ to $L_3$ may be each independently selected from i) a phenylene group, a naphthylene group, and a fluorenylene group; and ii) a phenylene group, a naphthylene group, and a fluorenylene group, each substituted with at least one substituent selected from a substituent selected from a phenyl group and a naphthyl group, but are not limited thereto.

In Formula 1, n1 to n3 may be each independently an integer of 0 to 3.

When n1 is 2 or greater, a plurality of $L_1$s may be identical to or different from each other. When n2 is 2 or greater, a plurality of $L_2$s may be identical to or different from each other. When n3 is 2 or greater, a plurality of $L_3$s may be identical to or different from each other.

In some embodiments, in Formula 1, n1 to n3 may be each independently 0 or 1, but are not limited thereto.

According to another embodiment of the present invention, the auxiliary material represented by Formula 1 may be represented by Formula 1a below, but is not limited thereto:

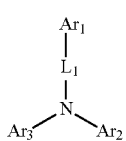

Formula 1a wherein, in Formula 1, $Ar_1$ and $Ar_3$ may be each independently selected from i) a phenyl group, a naphthyl group, a fluorenyl group, a carbazolyl group, a dibenzopuranyl group, and a dibenzothienyl group; and ii) a phenyl group, a naphthyl group, a fluorenyl group, a carbazolyl group, a dibenzopuranyl group, and a dibenzothienyl group, each substituted with at least one substituent selected from a phenyl group, a biphenyl group, a naphthyl group, a pyridinyl group, a pyrimidinyl group, and a triazinyl group;

$L_1$ to $L_3$ may be each independently selected from i) a phenylene group, a naphthylene group, and a fluorenylene group; and ii) a phenylene group, a naphthylene group, and a fluorenylene group, each substituted with at least one substituent selected from a phenyl group and a naphthyl group.

In some other embodiments, the auxiliary material represented by Formula 1 may be selected from any one of Compounds 101 to 119, but is not limited thereto:

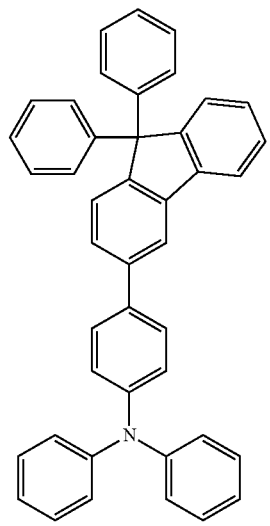

101

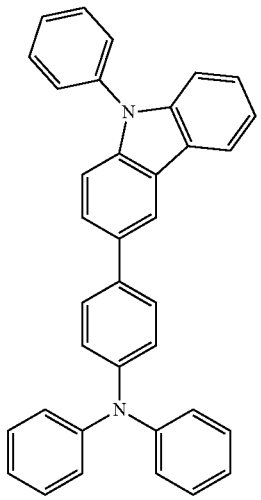

102

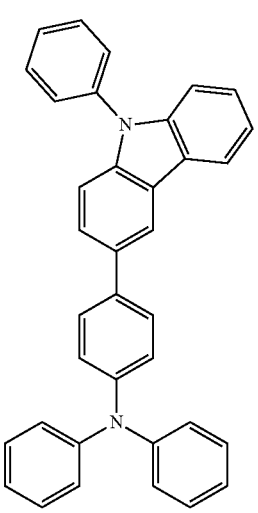

103

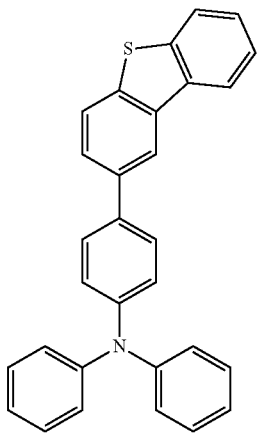

104

-continued
105
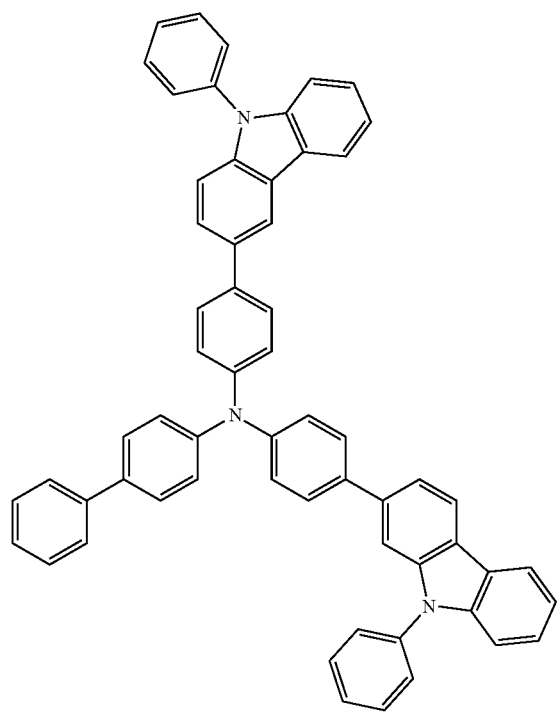
106
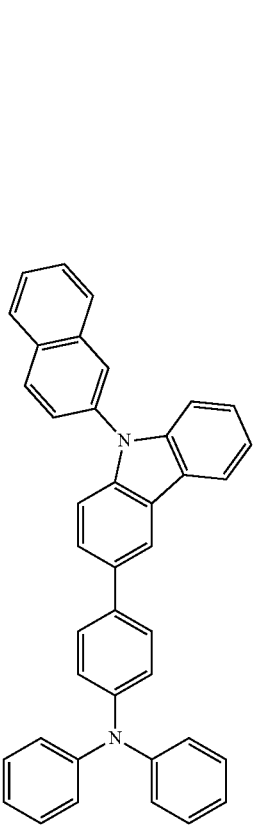
-continued
107
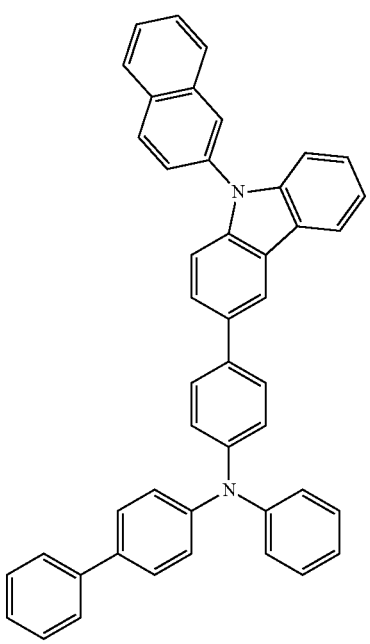
109
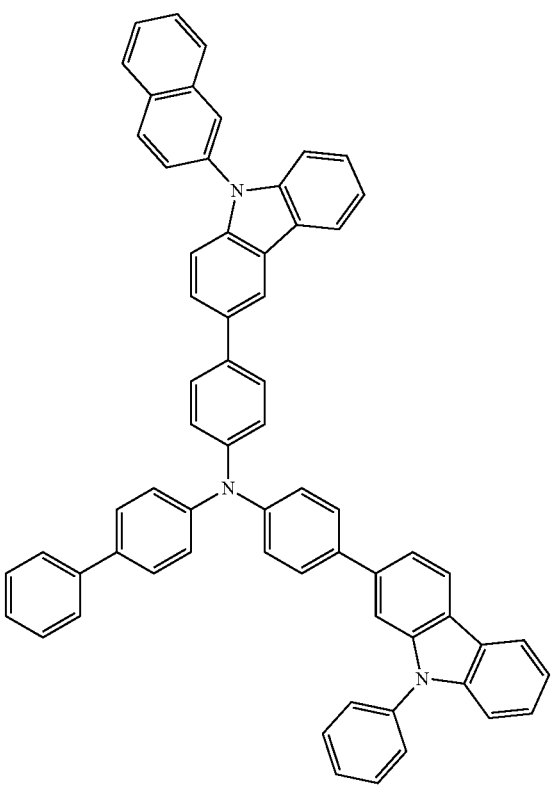

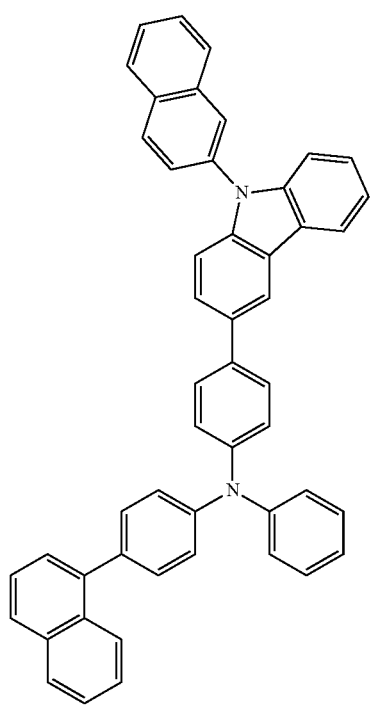
110
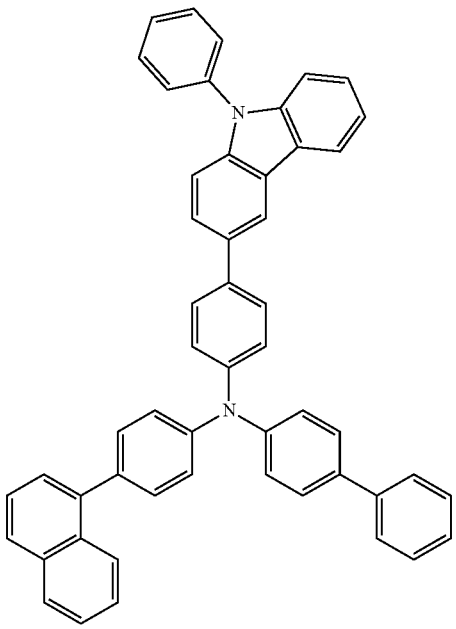
112
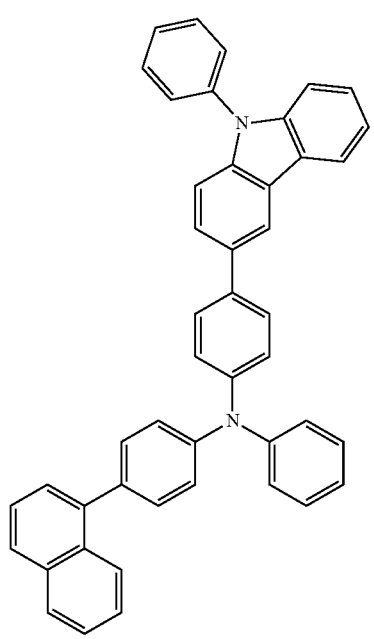
111
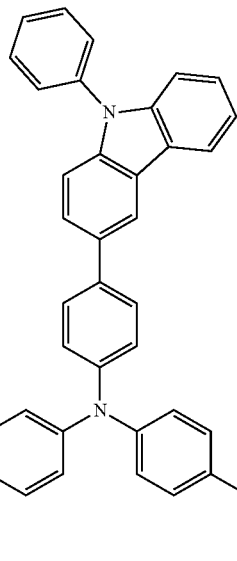
113

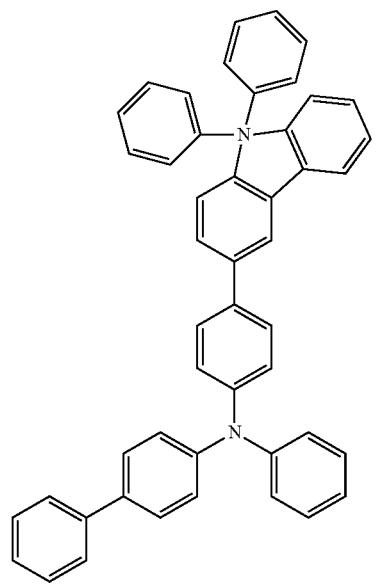
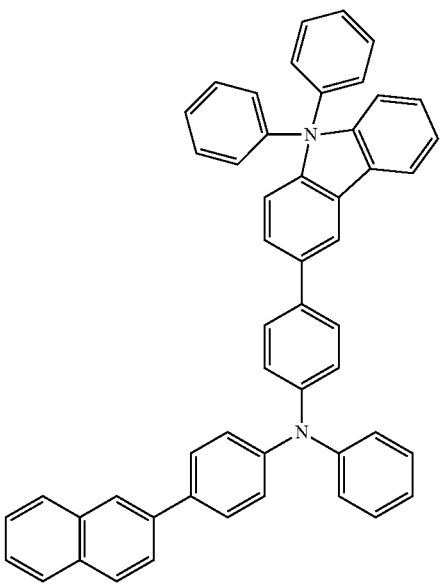

112
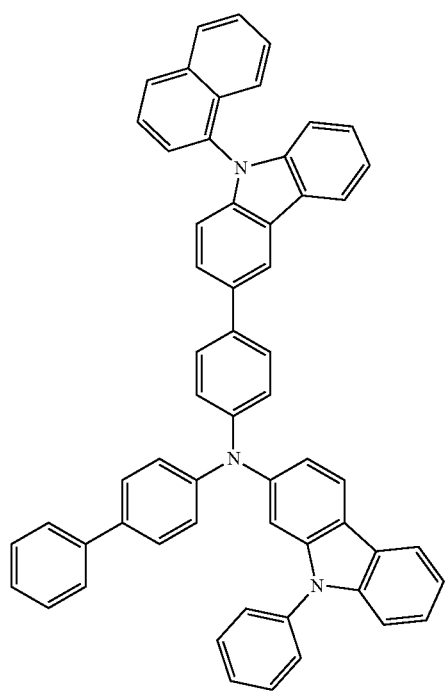
113
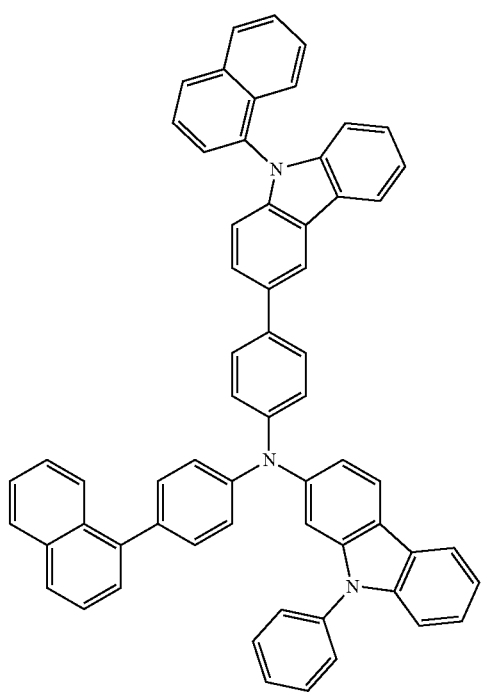
114
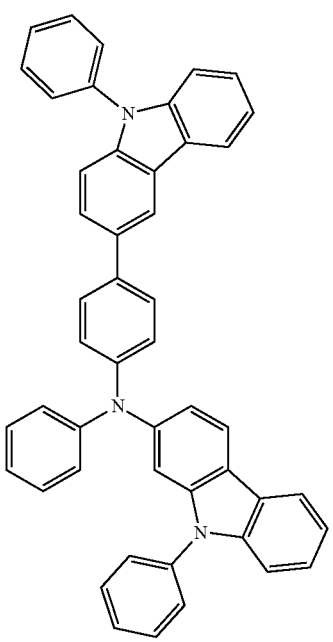
115
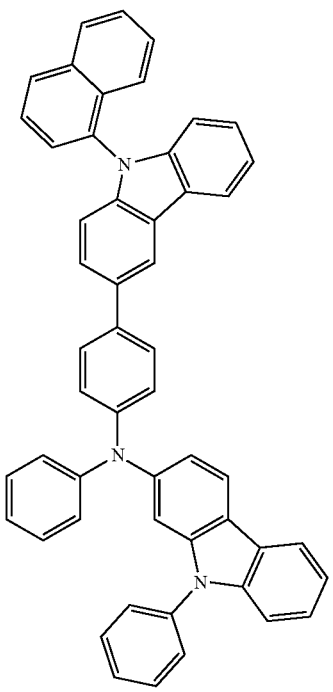

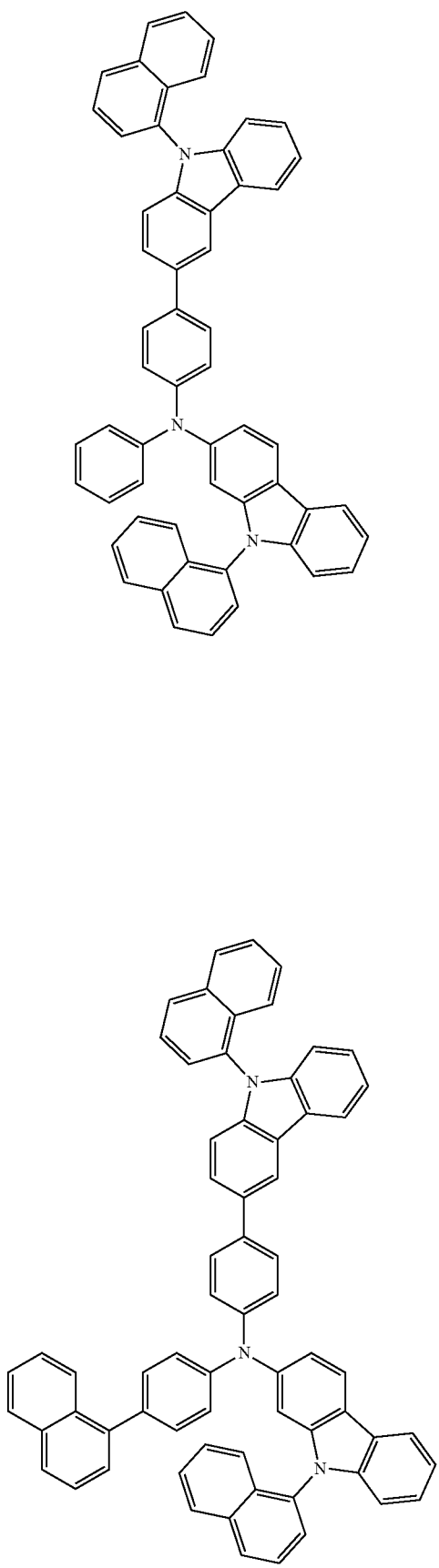

116

117

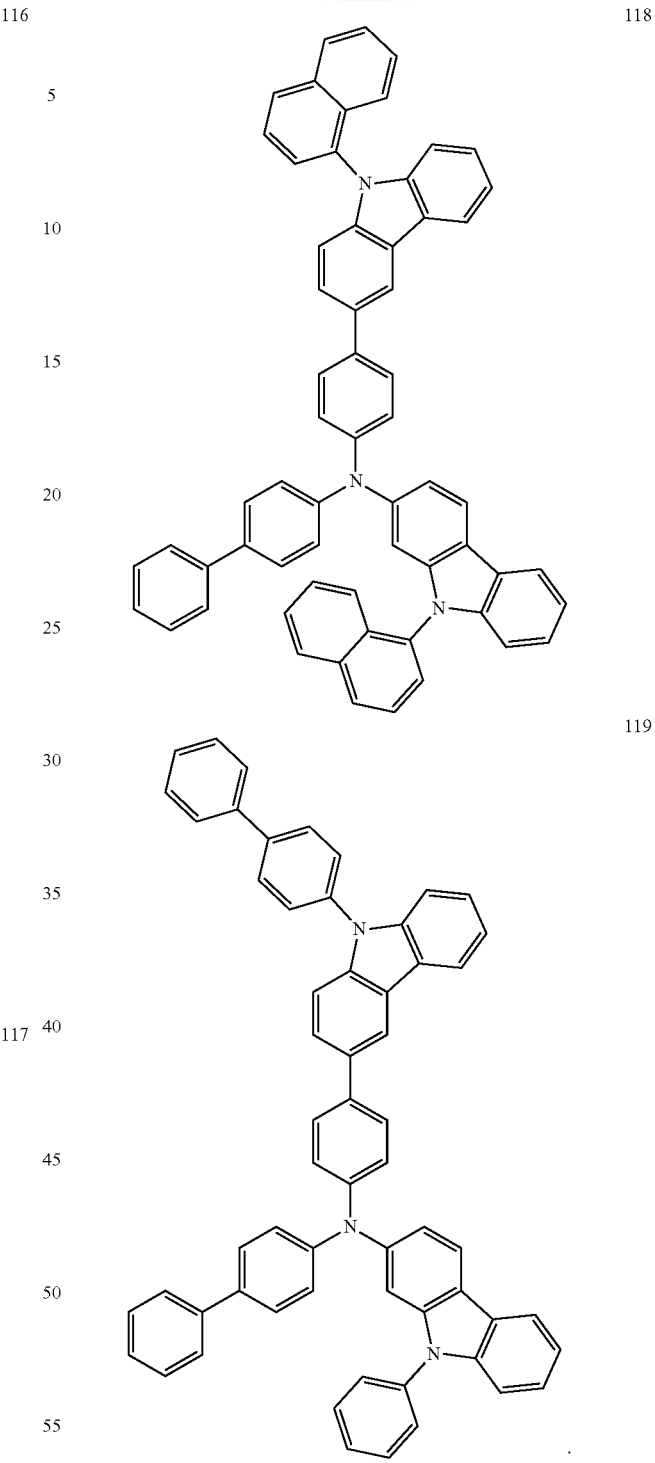

118

119

The auxiliary material represented by Formula 1 may be synthesized by using (utilizing) suitable organic synthesis methods. Synthesis methods of the auxiliary material represented by Formula 1 are understood by referring to Examples presented herein.

Subsequently, an emission layer (EML) 130 may be formed on the HIL, the H-functional layer, the buffer layer, or the auxiliary layer by using (utilizing) various suitable methods, such as vacuum deposition, spin coating, casting, or an LB method. When the EML 130 is formed using (utilizing) vacuum deposition or spin coating, the deposition and coating conditions may be similar to those applied to form the HIL, although the deposition and coating conditions may vary according to the material that is used (utilized) to form the EML 130.

The EML 130 may include at least one selected from suitable light-emitting materials represented by Formula 2 below:

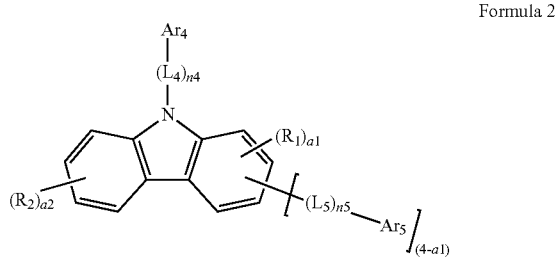

Formula 2 wherein, in Formula 2, $Ar_4$ and $Ar_5$ may be each independently selected from i) a $C_6$-$C_{60}$ aryl group and a $C_1$-$C_{60}$ heteroaryl group; and ii) a $C_6$-$C_{60}$ aryl group and a $C_1$-$C_{60}$ heteroaryl group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group.

In some embodiments, in Formula 2, $Ar_4$ and $Ar_5$ may be each independently selected from i) a phenyl group, a pentalenyl group, a naphthyl group, an azulenyl group, a heptalenyl group, an indacenyl group, a substituted acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzopuranyl group, and a dibenzothienyl group; and ii) a phenyl group, a pentalenyl group, a naphthyl group, an azulenyl group, a heptalenyl group, an indacenyl group, a substituted acenaphthyl group, a fluorenyl group), a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzopuranyl group, and a dibenzothienyl group, each substituted with at least one substituent selected from a deuterium, —F, —Cl, —Br, —I, a cyano group, a nitro group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group, but are not limited thereto.

In some other embodiments, in Formula 2, $Ar_4$ and $Ar_5$ may be each independently selected from i) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group;

ii) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a deuterium, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-buthoxy group;

iii) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group; and iv) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group, each substituted with at least one substituent selected from a deuterium, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-buthoxy group, but are not limited thereto.

In some other embodiments, in Formula 2, $Ar_4$ and $Ar_5$ may be each independently selected from i) a phenyl group, a naphthyl group, a fluorenyl group, a pyridinyl group, a pyrimidinyl group, and a triazinyl group; and ii) a phenyl group, a naphthyl group, a fluorenyl group, a pyridinyl group, a pyrimidinyl group, and a triazinyl group, each substituted with at least one substituent selected from a phenyl group, a naphthyl group, a pyridinyl group, a pyrimidinyl group, and a triazinyl group, but are not limited thereto.

In some other embodiments, in Formula 2, $Ar_4$ and $Ar_5$ may be each independently selected from i) a phenyl group and a naphthyl group; and ii) a phenyl group, a naphthyl group, and a triazinyl group, each substituted with at least one substituent selected from a phenyl group, a naphthyl, group, and a triazinyl group.

In Formula 2, $L_4$ and $L_5$ may be each independently selected from i) a $C_6$-$C_{60}$ arylene group and a $C_1$-$C_{60}$ heteroarylene group; and ii) a $C_6$-$C_{60}$ arylene group and a $C_1$-$C_{60}$ heteroarylene group, each substituted with at least one substituent selected from a deuterium, —F, —Cl, —Br, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group.

In some other embodiments, in Formula 2, $L_4$ and $L_5$ may be each independently selected from i) a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene group; and ii) a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group, but are not limited thereto.

In some other embodiments, $L_4$ and $L_5$ may be each independently selected from i) a phenylene group, a naphthylene group, a fluorenylene group, a pyridinylene group, a pyrazinylene group, a pyrimidinylene group, a pyridazinylene group, a carbazolylene group, and a triazolylene group; and ii) a phenylene group, a naphthylene group, a fluorenylene group, a pyridinylene group, a pyrazinylene group, a pyrimidinylene group, a pyridazinylene group, a carbazolylene group, and a triazolylene group, each substituted with at least one substituent selected from a phenyl group, a naphthyl group, a pyridinyl group, a pyrimidinyl group, and a triazinyl group, but are not limited thereto.

In some other embodiments, in Formula 2, $L_4$ and $L_5$ may be each independently selected from i) a pyridinylene group, a pyrazinylene group, a pyrimidinylene group, a pyridazinylene group, a carbazolylene group, and a triazolylene group; and ii) a pyridinylene group, a pyrazinylene group, a pyrimidinylene group, a pyridazinylene group, a carbazolylene group, and a triazolylene group, each substituted with at least one substituent selected from a phenyl group, a naphthyl group, a pyridinyl group, a pyrimidinyl group, and a triazinyl group, but are not limited thereto.

In some other embodiments, in Formula 2, $L_5$ may be a carbazolylene group, but is not limited thereto.

In Formula 2, n4 and n5 may be each independently an integer of 0 to 3. When n4 is 2 or greater, a plurality of $L_4$s may be identical to or different from each other. When n5 is 2 or greater, a plurality of $L_5$s may be identical to or different from each other.

In some embodiments, in Formula 2, n4 and n5 may be each independently 0 or 1, but are not limited thereto.

In Formula 2, $R_1$ and $R_2$ may be each independently selected from a hydrogen, a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group, but are not limited thereto.

In some embodiments, in Formula 2, $R_1$ and $R_2$ may be each independently selected from a hydrogen, a deuterium, —F, —Cl, —Br, —I, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, a tert-buthoxy group, a phenyl group, a naphthyl group, a pyridinyl group, a pyrimidinyl group, and a triazinyl group, but are not limited thereto.

In some other embodiments, in Formula 2, $R_1$ and $R_2$ may be each independently selected from a hydrogen, a deuterium, and a phenyl group, but are not limited thereto.

In Formula 2, a1 and a2 may be each independently an integer of 0 to 4. When a1 is 2 or greater, a plurality of $R_1$s may be identical to or different from each other. When a2 is 2 or greater, a plurality of $R_2$s may be identical to or different from each other.

For example, in Formula 2, $R_1$ may be a hydrogen and a1 may be 3.

For example, in Formula 2, $R_2$ may be a hydrogen and a2 may be 4.

According to another embodiment of the present invention, the auxiliary material represented by Formula 2 may be represented by Formula 2a below, but is not limited thereto:

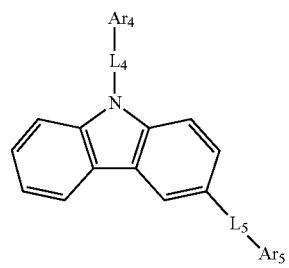

Formula 2a wherein, in Formula 2a, $Ar_4$ and $Ar_5$ may be each independently selected from i) a phenyl group and a naphthyl group; and ii) a phenyl group, a naphthyl group, and a triazinyl group, each substituted with at least one substituent selected from a phenyl group, a naphthyl group, and a triazinyl group;

$L_4$ may be selected from i) a pyridinylene group, a pyrazinylene group, a pyrimidinylene group, a pyridazinylene group, a carbazolylene group, and a triazolylene group; and ii) a pyridinylene group, a pyrazinylene group, a pyrimidinylene group, a pyridazinylene group, a carbazolylene group, and a triazolylene group, each substituted with at least one substituent selected from a phenyl group, a naphthyl group, a pyridinyl group, a pyrimidinyl group, and a triazinyl group; and $L_5$ may be a carbazolyl group.

According to another embodiment of the present invention, the auxiliary material represented by Formula 2 may be represented by Formula 2b below, but is not limited thereto:

Formula 2b

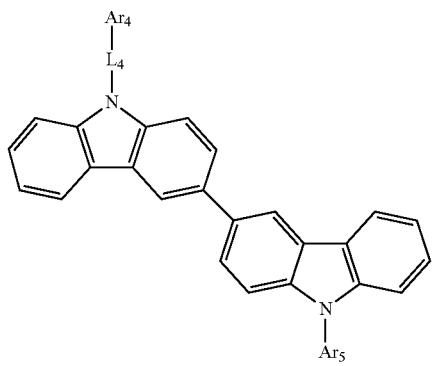

wherein, in Formula 2b,

Ar$_4$ and Ar$_5$ may be each independently selected from i) a phenyl group and a naphthyl group; and ii) a phenyl group, a naphthyl group, and a triazinyl group, each substituted with at least one substituent selected from a phenyl group and a triazinyl group; and L$_4$ may be selected from i) a pyridinylene group, a pyrazinylene group, a pyrimidinylene group, a pyridazinylene group, a carbazolylene group, and a triazolylene group; and ii) a pyridinylene group, a pyrazinylene group, a pyrimidinylene group, a pyridazinylene group, a carbazolylene group, and a triazolylene group, each substituted with at least one substituent selected a phenyl group, a naphthyl group, a pyridinyl group, a pyrimidinyl group, and a triazinyl group.

In some other embodiments, the auxiliary material represented by Formula 2 may be selected from any one of Compounds 210 to 232, but is not limited thereto:

210

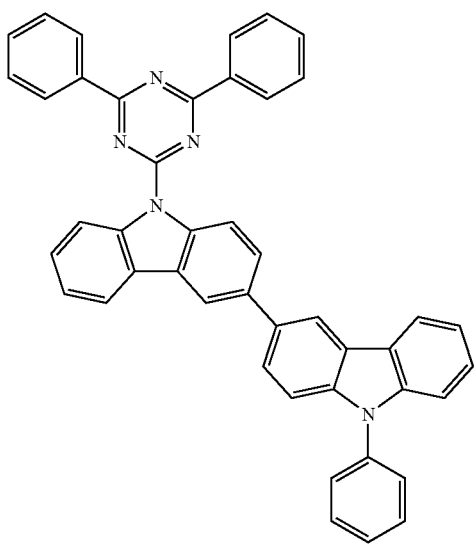

211

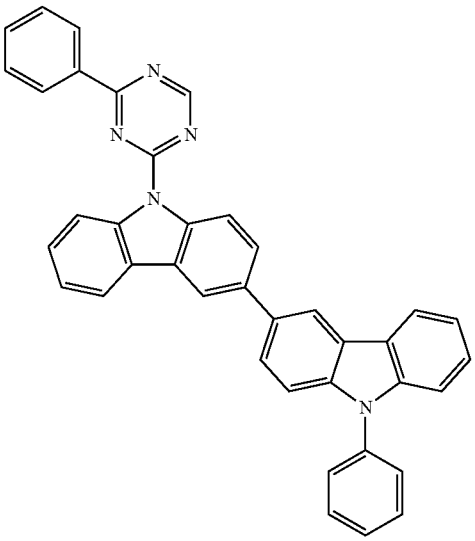

212

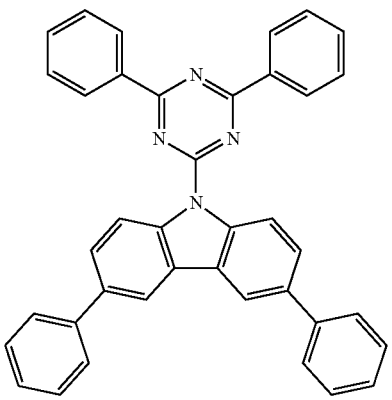

213

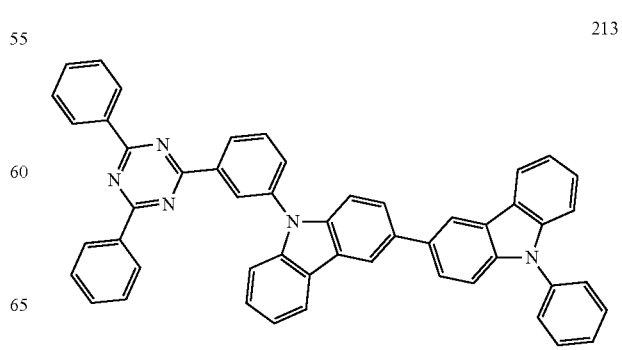

214
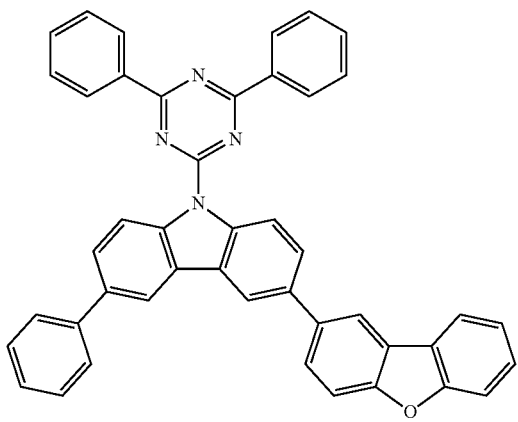
215
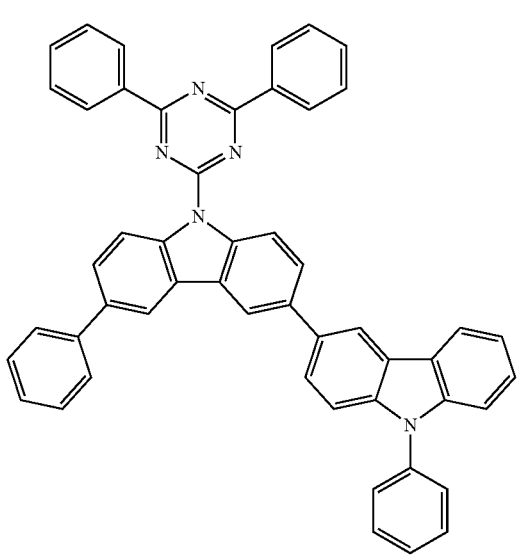
216
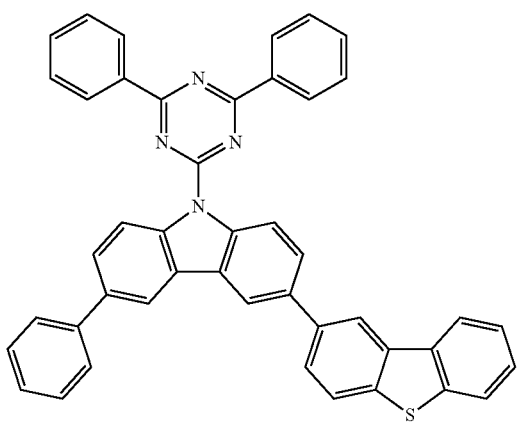
217
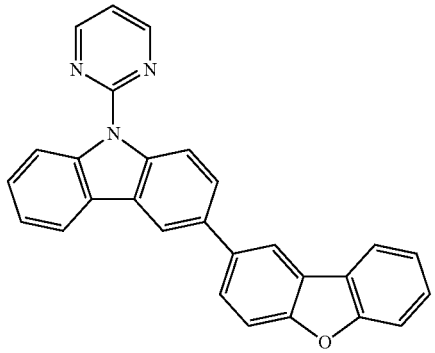
218
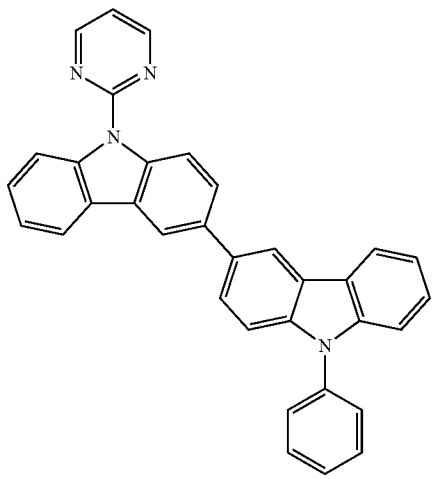
219
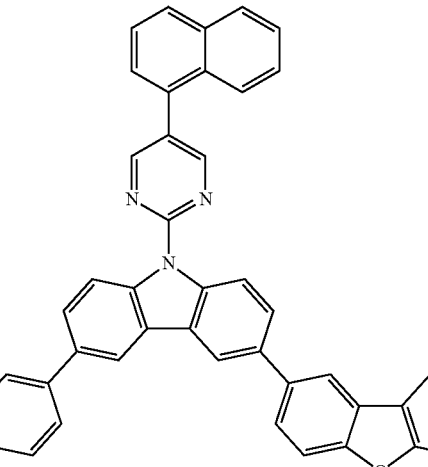

220
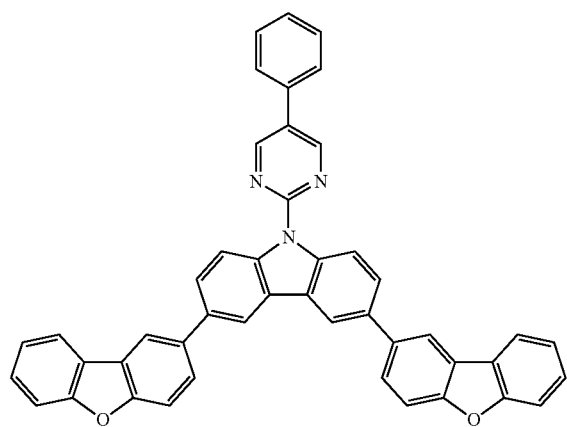
221
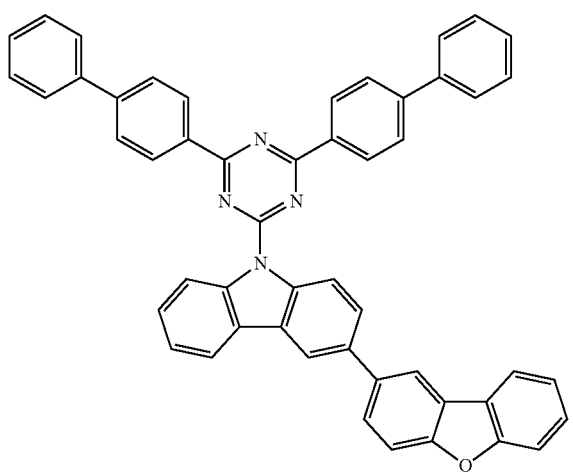
222
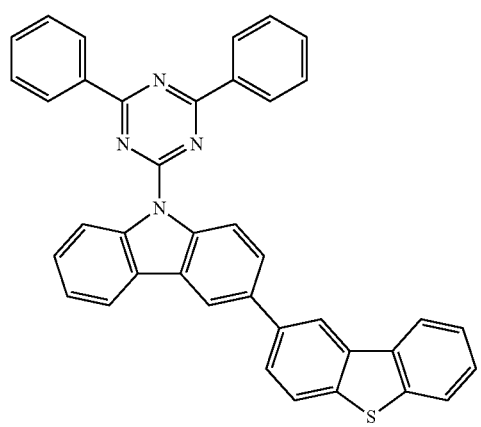
223
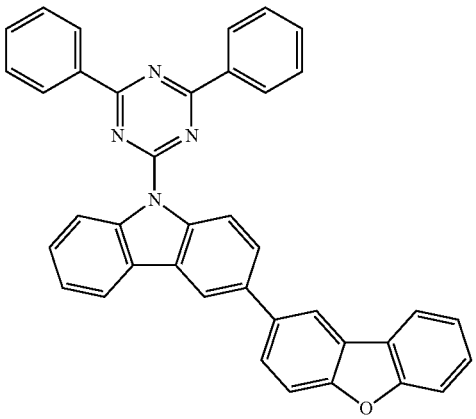
224
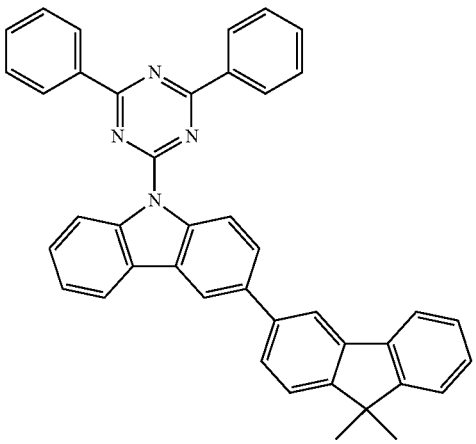
225
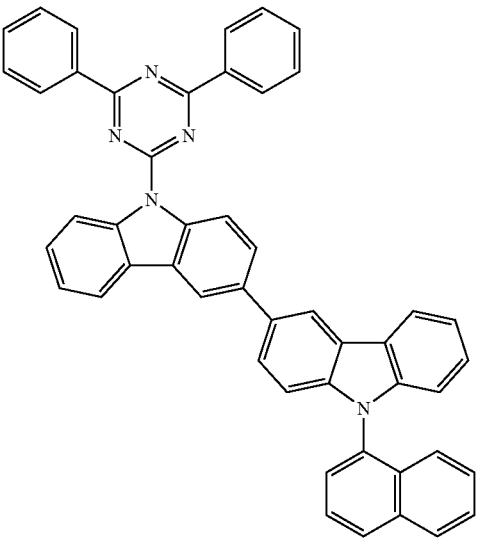

-continued
226
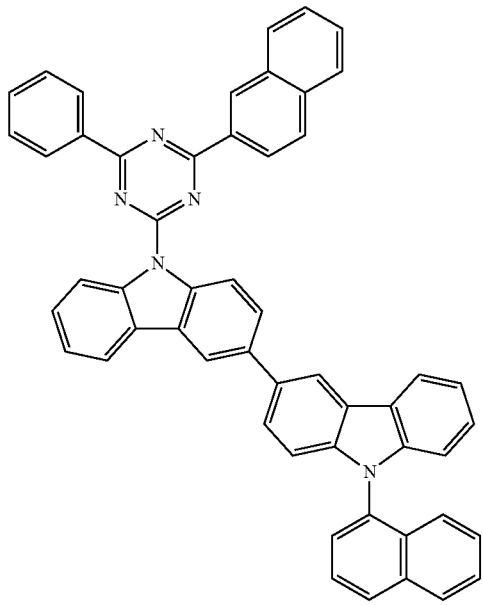
227
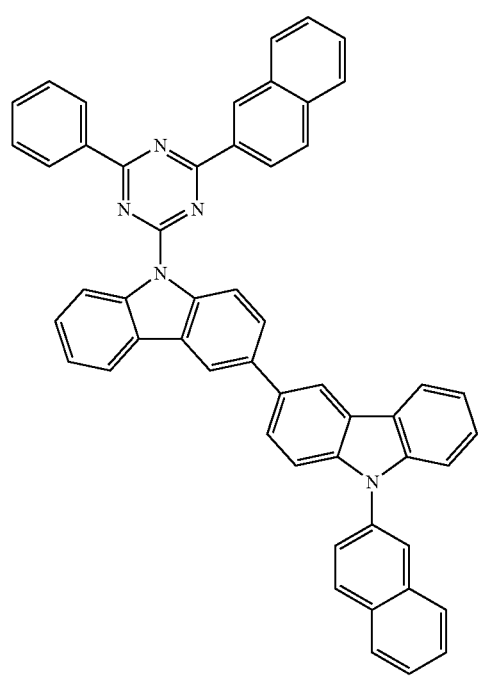
-continued
228
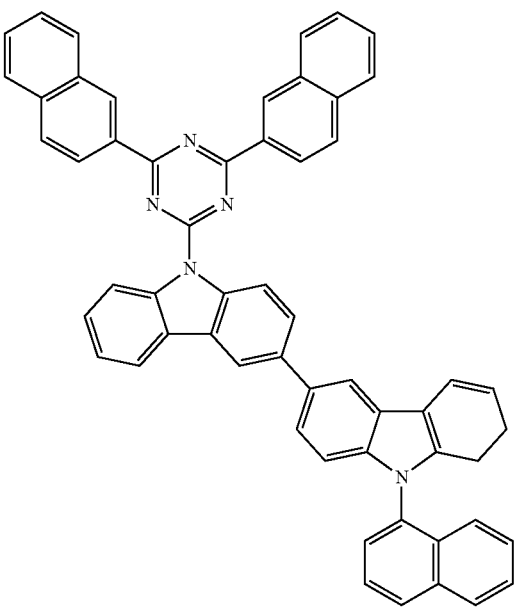
229
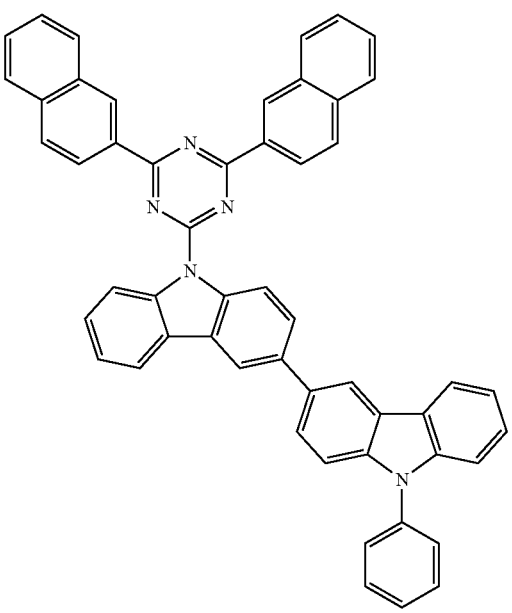

-continued

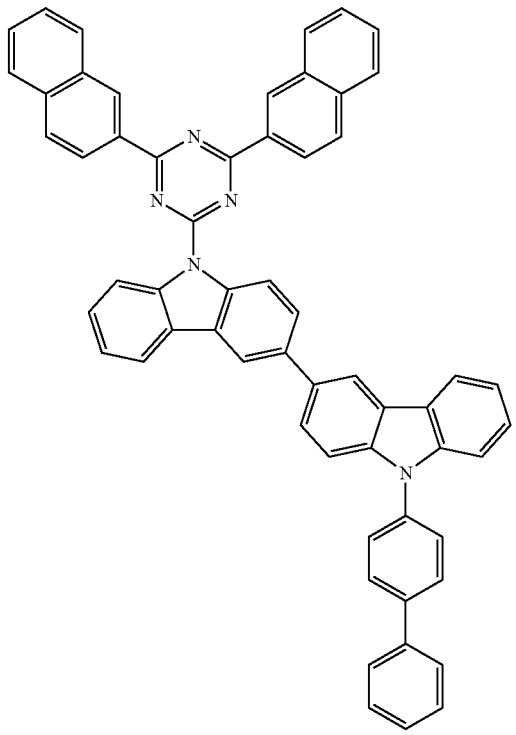

230

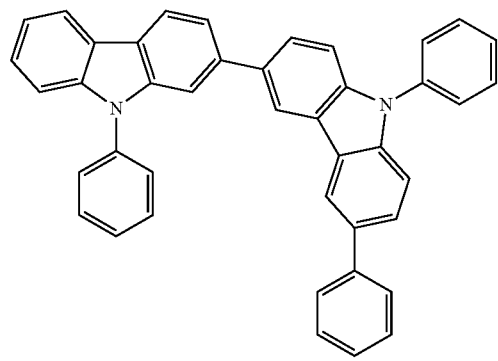

231

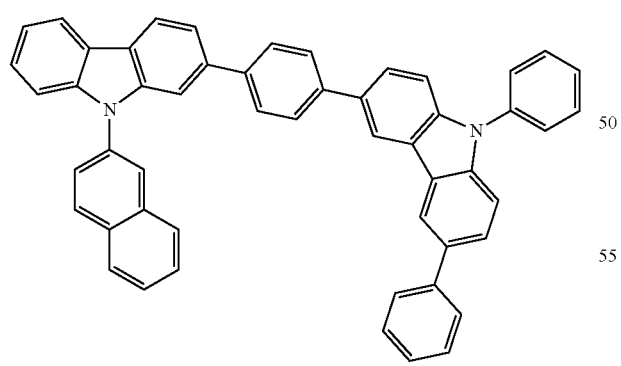

232

The light-emitting materials represented by Formula 2 may act as a host. Here, the EML 130 may further include a dopant in addition to the light-emitting materials represented by Formula 2. The dopant may be a phosphorescent dopant.

Such a dopant may be a complex illustrated below or an organometallic compound including iridium (Ir), platinum (Pt), or osmium (Os).

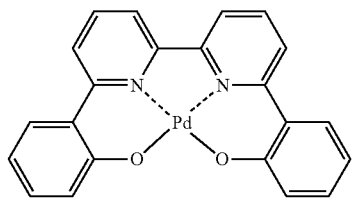

D1

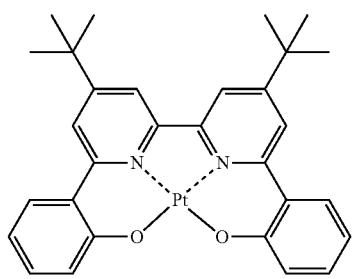

D2

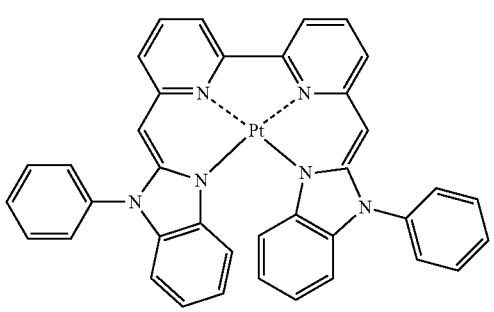

D3

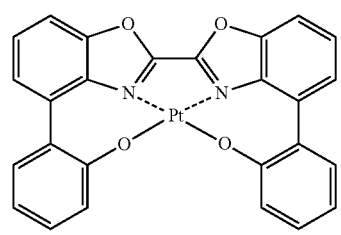

D4

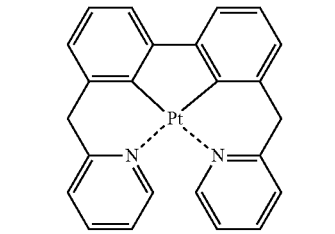

D5

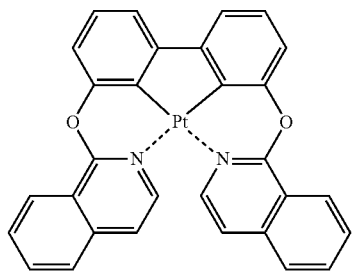

D6

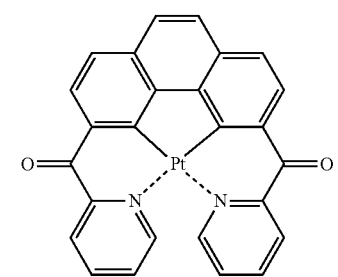
D7
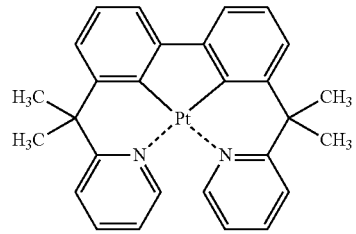
D8
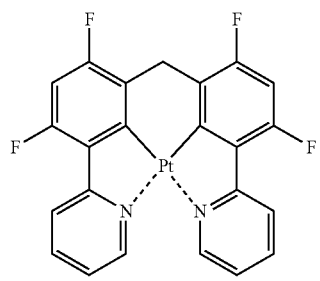
D9
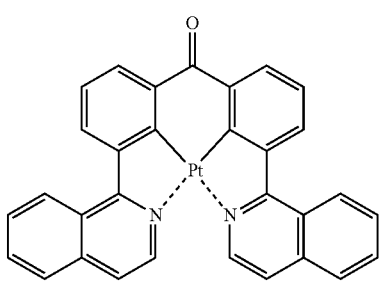
D10
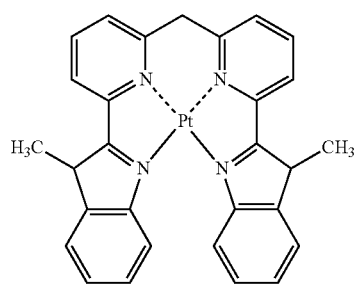
D11
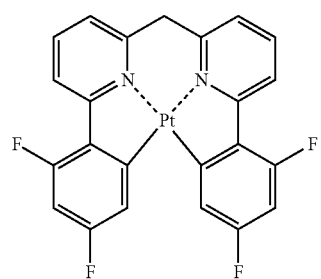
D12
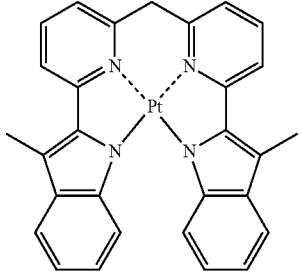
D13
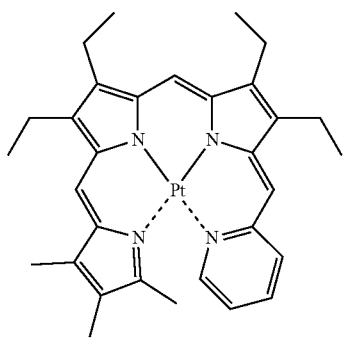
D14
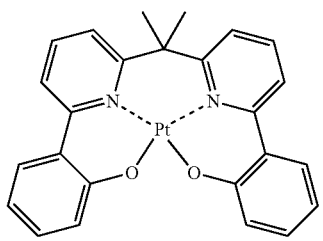
D15
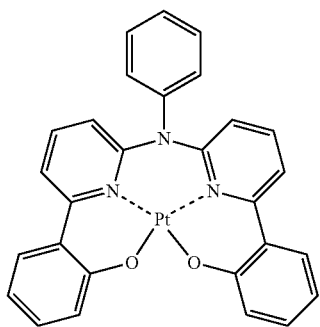
D16
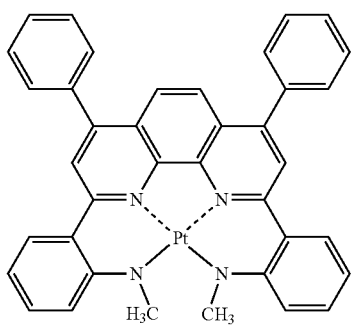
D17

D18 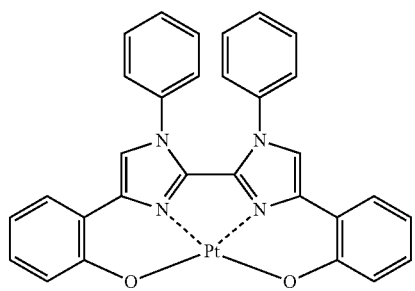
D19 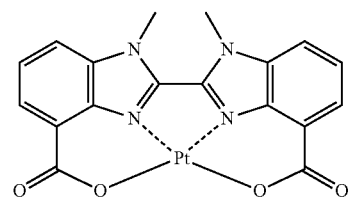
D20 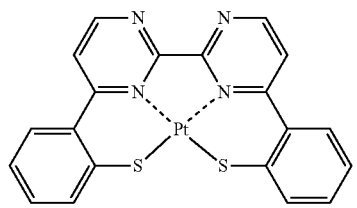
D21 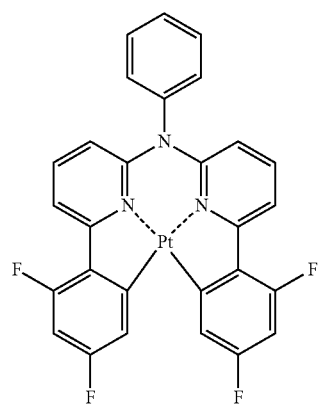
D22 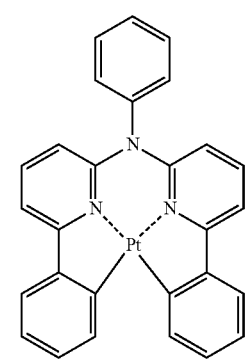
D23 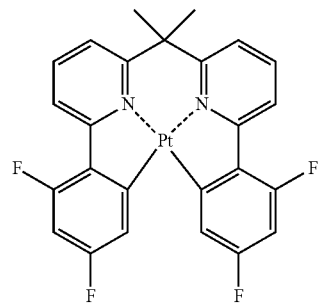
D24 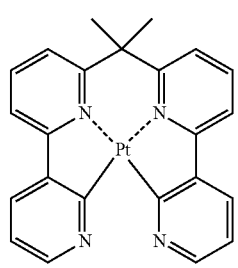
D25 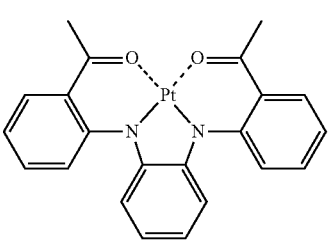
D26 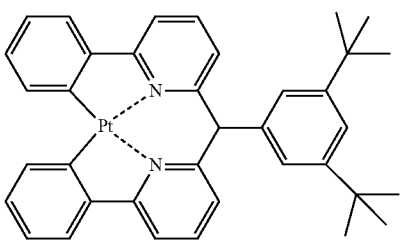
D27 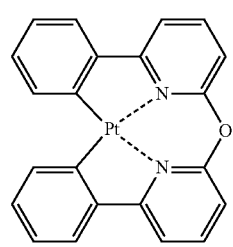
D28 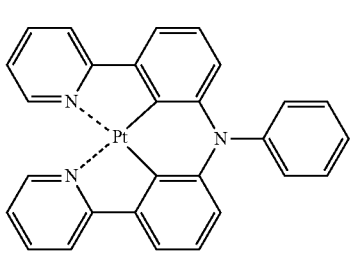

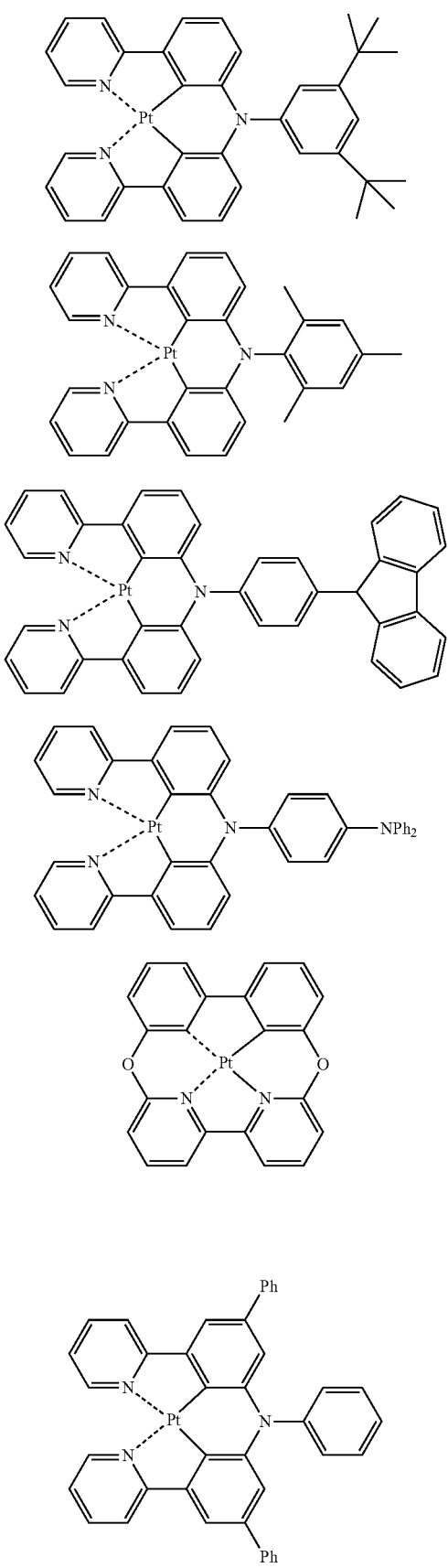
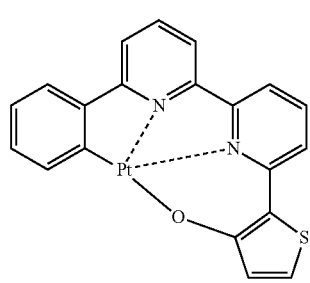
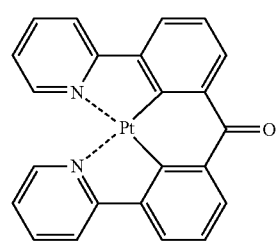
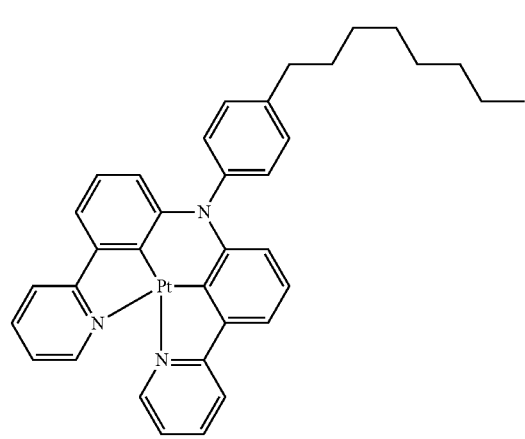
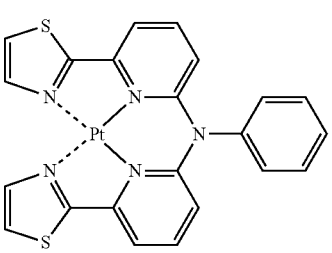
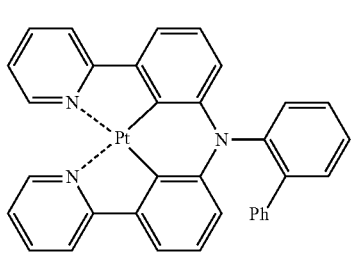

D40
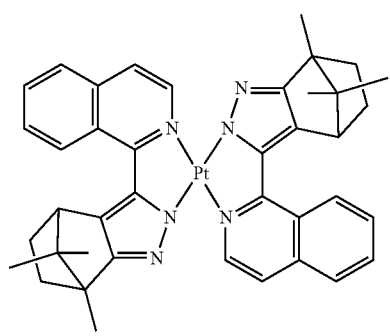
D41
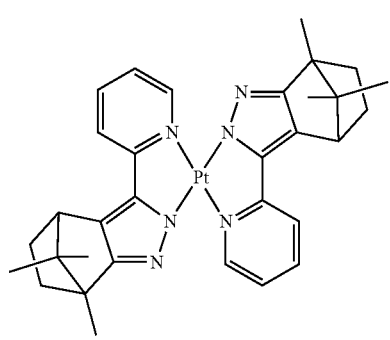
D42
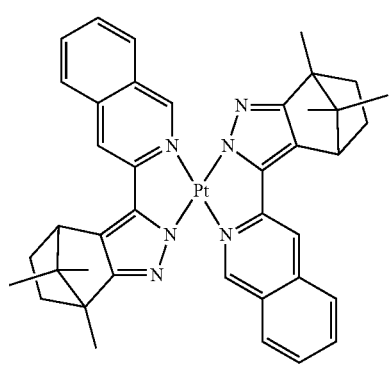
D43
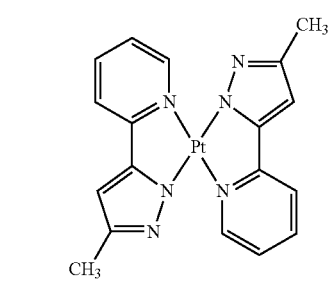
D44
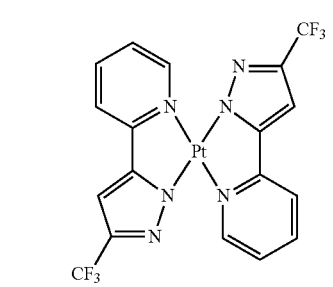
D45
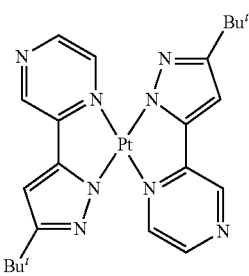
D46
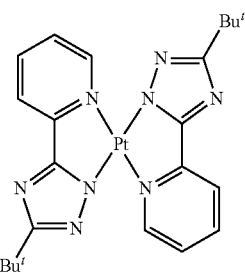
D47
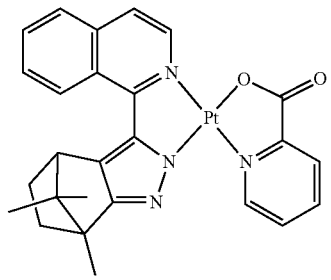
D48
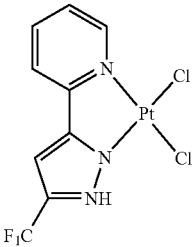
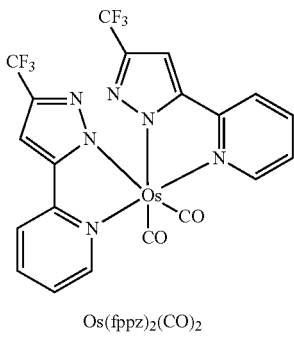
Os(fppz)₂(CO)₂

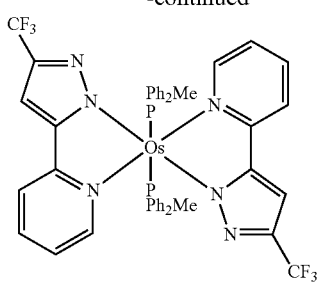
Os(fppz)₂(PPh₂Me)₂
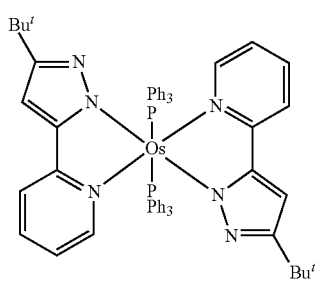
Os(bppz)₂(PPh₃)₂
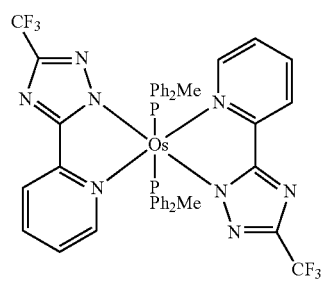
Os(fptz)₂(PPh₂Me)₂
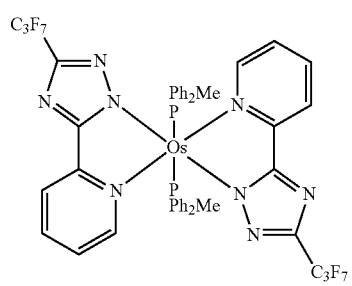
Os(bptz)₂(PPh₂Me)₂
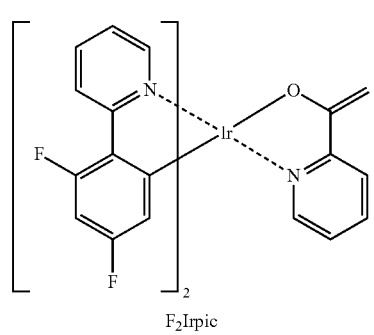
F₂Irpic
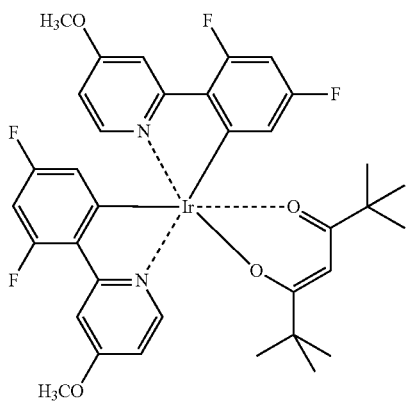
(F2ppy)2Ir(tmd)
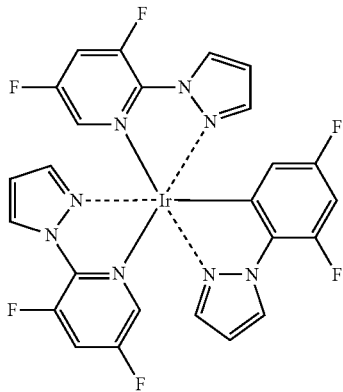
Ir(dfppz)₃
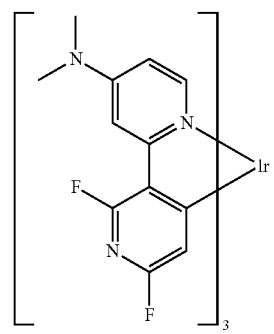
For example, compounds illustrated below may be used (utilized) as a blue phosphorescent dopant, but the blue phosphorescent dopant is not limited thereto.

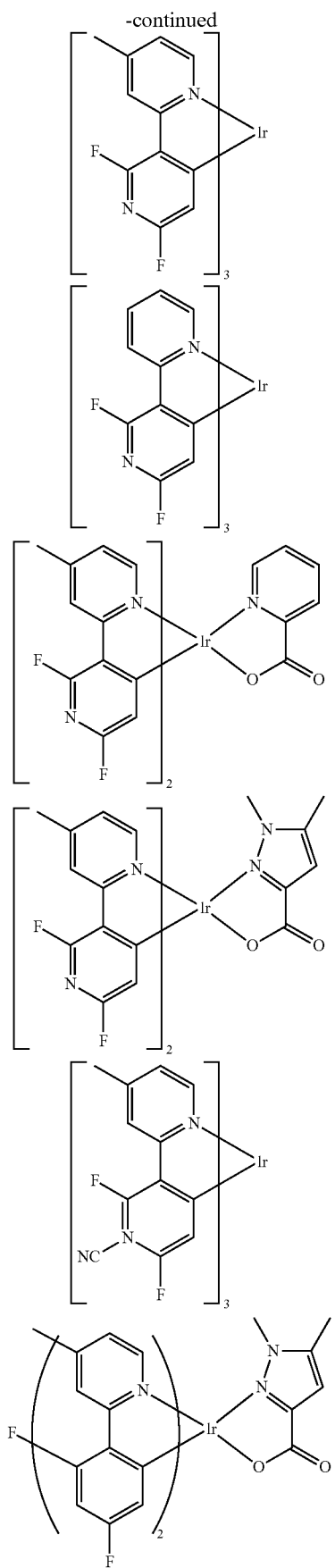
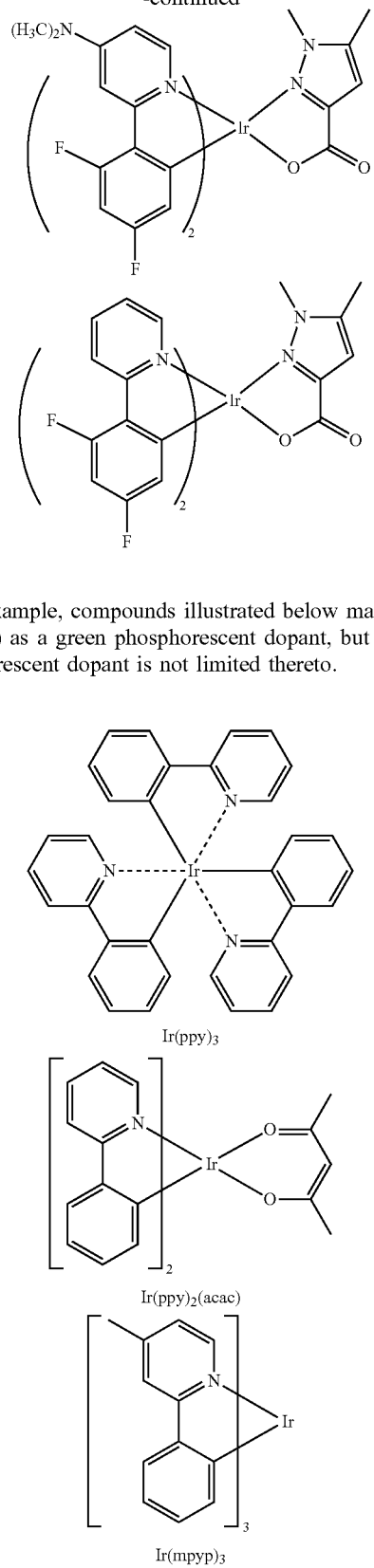
Ir(ppy)₃
Ir(ppy)₂(acac)
Ir(mpyp)₃
For example, compounds illustrated below may be used (utilized) as a green phosphorescent dopant, but the green phosphorescent dopant is not limited thereto.
The auxiliary material represented by Formula 2 may be synthesized by using (utilizing) suitable organic synthesis methods. Synthesis methods of the auxiliary material represented by Formula 2 are understood by referring to the Examples presented herein.

When the EML includes a host and a dopant, an amount of the dopant may be in a range of about 0.01 parts by weight to about 15 parts by weight based on 100 parts by weight of the EML, but is not limited thereto.

A thickness of the EML may be in a range of about 200 Å to about 700 Å. In one embodiment, when the thickness of the EML is within this range, excellent light-emission characteristics are obtained without a substantial increase in driving voltage.

When the organic light-emitting device 1 is a full color organic light-emitting device, the EML may be patterned into a red EML, a green EML, and a blue EML. Also, the EML may include at least two of the red EML, the green EML, and the blue EML, which are stacked upon one another, to emit white light. Here, the green EML may include the light-emitting material represented by Formula 1 and the green phosphorescent dopant described above. Alternatively, the blue EML may include the light-emitting material represented by Formula 1 and the blue phosphorescent dopant described above.

Next, an electron transport layer (ETL) 140 is formed on the EML 130 by using (utilizing) various suitable methods, such as vacuum deposition, spin coating, or casting. When the ETL 140 is formed using (utilizing) vacuum deposition or spin coating, the deposition and coating conditions may be similar to those applied to form the HIL, although the deposition and coating conditions may vary according to the material that is used (utilized) to form the ETL 140. A material for forming the ETL 140 may stably transport electrons injected from an electron injection electrode (cathode), and may be a suitable electron transport material. Examples of suitable electron transport materials are a quinoline derivative, such as tris(8-quinolinolate)aluminum (Alq3), TAZ, Balq, beryllium bis(benzoquinolin-10-olate) (Bebq$_2$), ADN, Compound X, Compound Y, and Bphen, but are not limited thereto.

<Compound X>

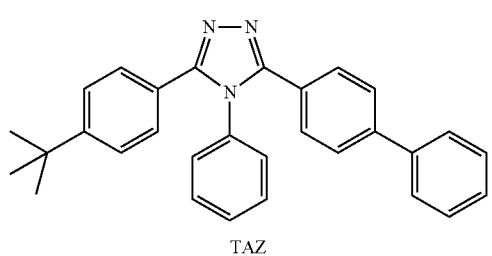

TAZ

<Compound Y>

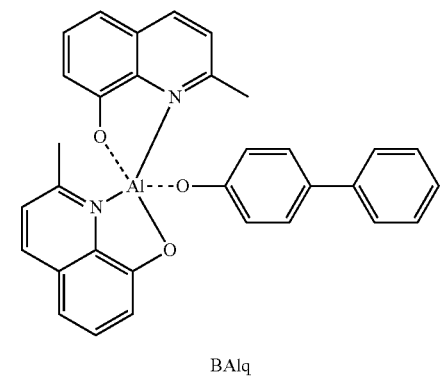

BAlq

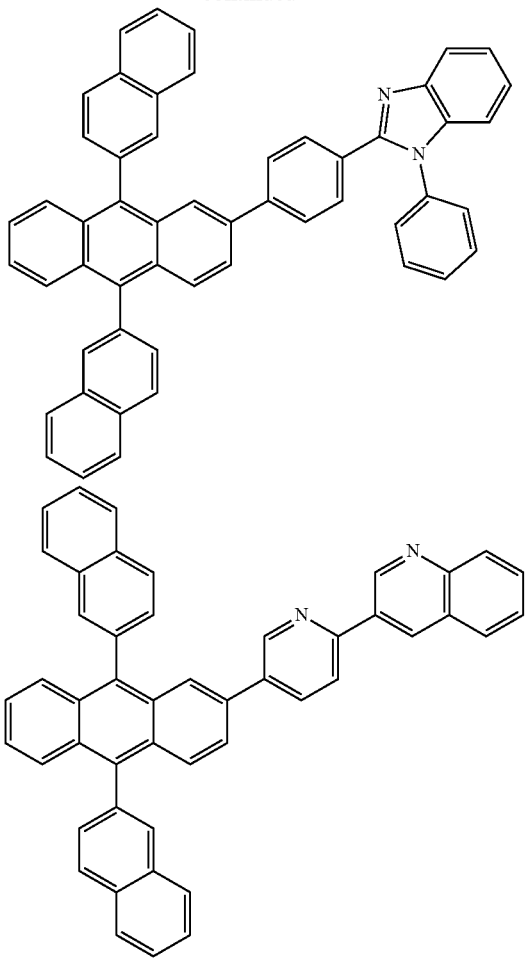

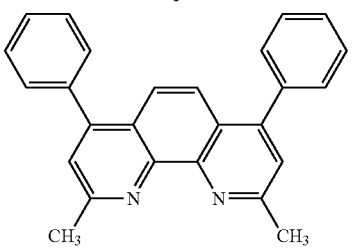

BCP

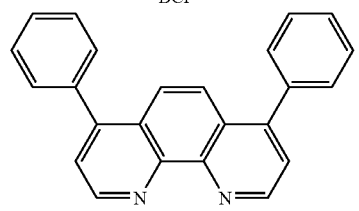

Bphen

A thickness of the ETL 140 may be in a range of about 100 Å to about 1,000 Å, for example, about 150 Å to about 500 Å. In one embodiment, when the thickness of the ETL 140 is within these ranges, satisfactory electron transport characteristics are obtained without a substantial increase in driving voltage.

Also, the ETL 140 may include, in addition to an electron transport organic compound, a metal-containing material.

The metal-containing material may include a lithium (Li) complex. Non-limiting examples of the Li complex are lithium quinolate (LiQ) and Compound Z illustrated below:

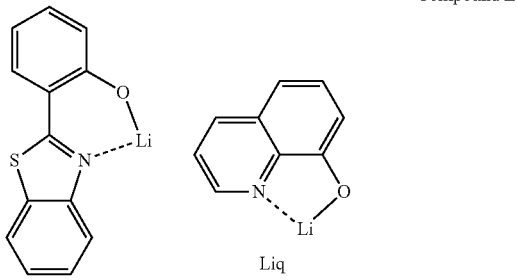

Then, an electron injection layer (EIL) 150, which facilitates injection of electrons from the cathode, may be formed on the ETL 140. Any suitable electron injection material may be used (utilized) to form the EIL 150.

Examples of electron injection materials are LiF, NaCl, CsF, Li$_2$O, and BaO, which are known in the art. The deposition conditions of the EIL 150 may be similar to those applied to form the HIL, although the deposition conditions may vary according to the material that is used (utilized) to form the ETL 140.

A thickness of the EIL 150 may be in a range of about 1 Å to about 100 Å, for example, about 3 Å to about 90 Å. In one embodiment, when the thickness of the EIL 150 is within these ranges, satisfactory electron injection characteristics are obtained without a substantial increase in driving voltage.

A second electrode 160 is disposed on the organic layer. The second electrode 160 may be a cathode that is an electron injection electrode, and in this regard, a metal for forming the second electrode 160 may be a material having a low work function, and such a material may be a metal, an alloy, an electrically conductive compound, or a mixture thereof. For example, lithium (Li), magnesium (Mg), aluminum (Al), aluminum-lithium (Al—Li), calcium (Ca), magnesium-indium (Mg—In), or magnesium-silver (Mg—Ag) may be formed as a thin film to obtain a transmissive electrode. Also, to manufacture a top emission light-emitting device, a transmissive electrode may be formed using (utilizing) ITO or IZO.

An auxiliary layer 121 includes at least one selected from auxiliary materials having a highest occupied molecular orbital (HOMO) energy level (EH) defined by 5.4 eV≤|EH|≤6.1 eV, and a triplet energy level (ET$_a$) defined by |ET$_a$|≥2.4 eV, wherein the EML 130 includes at least one selected from light-emitting materials having a triplet energy level (ET$_e$) defined by |ET$_e$|≥2.3 eV.

A lowest unoccupied molecular orbital (LUMO) energy level (EL$_a$) of the auxiliary layer 121 may be greater than that of the EML 130. Accordingly, the auxiliary layer 121 may have electron blocking characteristics.

In addition, the auxiliary materials have high electrical stabilities, and thus the organic light-emitting device 1 having such auxiliary materials may have improved lifespan and efficiency thereof at the same time.

Due to electron blocking characteristics of the auxiliary layer 121, the EML 130 and the auxiliary layer 121 may be disposed adjacent to each other to improve the lifespan and efficiency of the organic light-emitting device 1.

The unsubstituted $C_1$-$C_{60}$ alkyl group (or a $C_1$-$C_{60}$ alkyl group) used herein may be a linear or branched $C_1$-$C_{60}$ alkyl group, and examples thereof are a methyl, an ethyl, a propyl, an isobutyl, a sec-butyl, a pentyl, an iso-amyl, and a hexyl group. At least one hydrogen atom of the unsubstituted $C_1$-$C_{60}$ alkyl group may be substituted with a deuterium atom; —F; —Cl; —Br; —I; —CN; a hydroxyl group; —NO$_2$; an amino group; an amidino group; a hydrazine; a hydrazone; a carboxyl group or a salt thereof; a sulfonic acid group or a salt thereof; a phosphoric acid group or a salt thereof; a tri($C_6$-$C_{60}$ aryl)silyl group; a $C_1$-$C_{60}$ alkyl group, a $C_1$-$C_{60}$ alkoxy group, a $C_2$-$C_{60}$ alkenyl group, or a $C_2$-$C_{60}$ alkynyl group; a $C_1$-$C_{60}$ alkyl group, a $C_1$-$C_{60}$ alkoxy group, a $C_2$-$C_{60}$ alkenyl group, or a $C_2$-$C_{60}$ alkynyl group, each substituted with at least one substituent selected from a deuterium, —F, —Cl, —Br, —I, —CN, a hydroxyl group, —NO$_2$, an amino group, an amidino group, a hydrazine, a hydrazone, carboxyl group or a salt thereof, a sulfonic acid group or a salt thereof, or a phosphoric acid group or a salt thereof; a $C_3$-$C_{60}$ cycloalkyl group, a $C_3$-$C_{60}$ cycloalkenyl group, a $C_6$-$C_{60}$ aryl group, a $C_1$-$C_{60}$ heteroaryl group, a $C_6$-$C_{60}$ aralkyl group, a $C_6$-$C_{60}$ aryloxy group, and a $C_6$-$C_{60}$ arylthio group; or a $C_3$-$C_{60}$ cycloalkyl group, a $C_3$-$C_{60}$ cycloalkenyl group, a $C_6$-$C_{60}$ aryl group, a $C_1$-$C_{60}$ heteroaryl group, a $C_6$-$C_{60}$ aralkyl group, a $C_6$-$C_{60}$ aryloxy group, or a $C_6$-$C_{60}$ arylthio group, each substituted with at least one substituent selected from a deuterium, —F, —Cl, —Br, —I, —CN, a hydroxyl group, —NO$_2$, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one F, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_1$-$C_{60}$ heteroaryl group.

The unsubstituted $C_1$-$C_{60}$ alkoxy group (or a $C_1$-$C_{60}$ alkoxy group) used herein refers to a group having —OA (wherein A is the unsubstituted $C_1$-$C_{60}$ alkyl group), and examples thereof are a methoxy, an ethoxy, and an isopropyloxy. At least one hydrogen atom of the unsubstituted $C_1$-$C_{60}$ alkoxy group may be substituted with the same substituents as used (utilized) in the $C_1$-$C_{60}$ alkyl group described above.

The unsubstituted $C_2$-$C_{60}$ alkenyl group (or a $C_2$-$C_{60}$ alkenyl group) used herein refers to an unsubstituted $C_2$-$C_{60}$ alkyl group having one or more carbon double bonds at a center or end thereof. Examples of the unsubstituted $C_2$-$C_{60}$ alkenyl group are an ethenyl, a prophenyl, and a butenyl. At least one hydrogen atom of the unsubstituted $C_2$-$C_{60}$ alkenyl group may be substituted with the same substituents as used (utilized) in the $C_1$-$C_{60}$ alkyl group described above.

The unsubstituted $C_2$-$C_{60}$ alkynyl group (or a $C_2$-$C_{60}$ alkynyl group) used herein refers to an unsubstituted $C_2$-$C_{60}$ alkyl group having one or more carbon triple bonds at a center or end thereof. Examples of the unsubstituted $C_2$-$C_{60}$ alkynyl group are an ethynyl and a propynyl. At least one hydrogen atom of the unsubstituted $C_2$-$C_{60}$ alkynyl group may be substituted with the same substituent as used (utilized) in the $C_1$-$C_{60}$ alkyl group described above.

The unsubstituted $C_3$-$C_{60}$ cycloalkyl group used herein refers to a cyclic saturated monovalent hydrocarbon group containing 3 to 60 carbon atoms, and examples thereof are a cyclopropyl, a cyclobutyl, a cyclopentyl, a cyclohexyl, and a cyclooctyl. At least one hydrogen atom of the unsubstituted $C_3$-$C_{60}$ cycloalkyl group may be substituted with the same substituents as used (utilized) in the $C_1$-$C_{60}$ alkyl group described above.

The unsubstituted $C_3$-$C_{60}$ cycloalkenyl group used herein refers to a cyclic unsaturated hydrocarbon group that has one or more carbon double bonds and does not have an aromatic ring, and examples thereof are a cyclopropenyl, a cyclobutenyl, a cyclopentenyl, a cyclohexenyl, a cycloheptenyl, a 1,3-cyclohexadienyl, a 1,4-cyclohexadienyl, a 2,4-cyclohexadienyl, and a 1,5-cyclooctadienyl. At least one hydrogen atom of the unsubstituted $C_3$-$C_{60}$ cycloalkenyl group may be substituted with the same substituents as used (utilized) in the $C_1$-$C_{60}$ alkyl group described above.

The unsubstituted $C_6$-$C_{60}$ aryl group used herein refers to a monovalent group having a carbocyclic aromatic system having 6 to 60 carbon atoms including at least one aromatic ring, and the unsubstituted $C_6$-$C_{60}$ arylene group used herein refers to a divalent group having a carbocyclic aromatic system having 6 to 60 carbon atoms including at least one aromatic ring. When the aryl group and the arylene group include two or more rings, the rings may be fused to each other. At least one hydrogen atom of the aryl group and the arylene group may be substituted with the same substituent as described above in conjunction with the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m-, and p-fluorophenyl group and a dichlorophenyl group), a dicyanophenyle group, a trifluoromethoxyphenyl group, o-, m-, and p-tolyl groups, o-, m-, and p-cumenyl groups, a mosityl group, a phenoxyphenyl group, an (α,α-dimethylbenzene)phenyl group, an (N,N'-dimethypaminophenyl group, an (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azrenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group, and examples of the substituted $C_6$-$C_{60}$ aryl group may be inferred based on those examples of the unsubstituted $C_6$-$C_{60}$ aryl group and the substituents described above in conjunction with the substituted $C_1$-$C_{60}$ alkyl group. Examples of the substituted or unsubstituted $C_6$-$C_{60}$ arylene group may be inferred based on those examples of the substituted or unsubstituted $C_6$-$C_{60}$ aryl group.

The unsubstituted $C_1$-$C_{60}$ heteroaryl group used herein refers to a monovalent group having a system composed of one or more aromatic rings having at least one heteroatom selected from N, O, P, and S as a ring-forming atom, and carbon atoms as the remaining ring atoms. The unsubstituted $C_1$-$C_{60}$ heteroarylene group used herein refers to a divalent group having a system composed of one or more aromatic rings having at least one heteroatom selected from N, O, P, and S as a ring-forming atom, and carbon atoms as the remaining ring atoms. Here, when the heteroaryl group and the heteroarylene group each include two or more rings, the rings may be fused to each other. At least one hydrogen atom of the heteroaryl group and the heteroarylene group may be substituted with the same substituent described above in conjunction with the $C_1$-$C_{60}$ alkyl group.

Examples of the unsubstituted $C_1$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_1$-$C_{60}$ heteroarylene group may be inferred based on those examples of the substituted or unsubstituted $C_2$-$C_{60}$ arylene group.

The substituted or unsubstituted $C_6$-$C_{60}$ aryloxy group is represented by the formula —$OA_2$ (wherein, $A_2$ is a substituted or unsubstituted $C_6$-$C_{60}$ aryl group). The substituted or unsubstituted $C_6$-$C_{60}$ arylthio group is represented by the formula —$SA_3$ (wherein, $A_3$ is a substituted or unsubstituted $C_6$-$C_{60}$ aryl group).

Hereinafter, embodiments of the present invention will be described in more detail with reference to the following synthesis examples and other examples. However, these examples are for illustrative purposes only and are not intended to limit the scope of the present invention.

EXAMPLE

Example 1

An anode was prepared by cutting a Corning 15 Ωcm² (1,200 Å) ITO glass substrate to a size of 50 mm×50 mm×0.7 mm, ultrasonically cleaning the glass substrate by using (utilizing) isopropyl alcohol for 5 minutes and pure water for 5 minutes, and then, irradiating UV light for 30 minutes thereto, and exposing to ozone to clean. Then, the anode was loaded onto a vacuum deposition apparatus.

Then, 4,4',4"-Tris(N-(2-naphthyl)-N-phenyl-amino)-triphenylamine (hereinafter, 2-TNATA) was vacuum deposited on the ITO glass substrate to form an HIL having a thickness of 600 Å, and then, 4,4'-bis[N-(1-naphthyl)-N-phenylamino]biphenyl(hereinafter, NPB) was vacuum deposited on the HIL to form an HTL having a thickness of 150 Å. Compound 101 was vacuum deposited on the HTL to form an auxiliary layer having a thickness of 150 Å. Compound 213, which is a host, and Ir(ppy)₃, which is a green phosphorescent dopant, were co-deposited on the auxiliary layer at a weight ratio of 90:10 to form an EML having a thickness of 400 Å. Next, Compound 200 was co-deposited on the EML to form an ETL having a thickness of 300 Å, and then, LiF was deposited on the ETL to form an EIL having a thickness of 10 Å. Then, Al was deposited to form a second electrode (cathode) having a thickness of 3,000 Å, thereby completing the manufacturing of an organic light-emitting device.

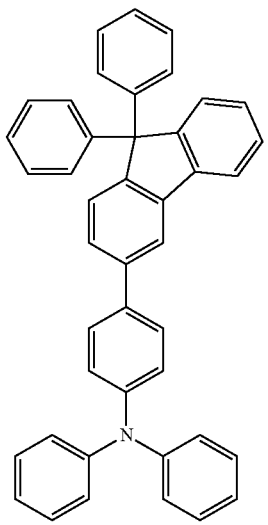

101

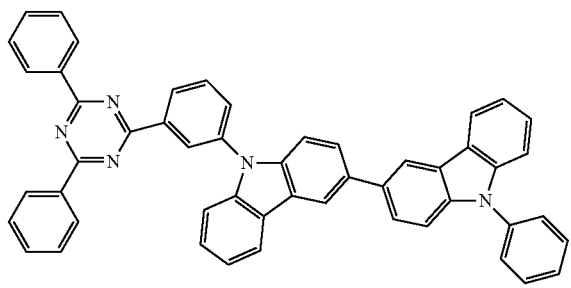

213

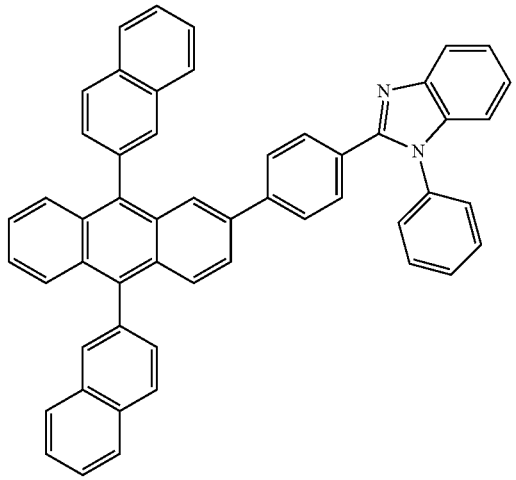

200

Example 2

An organic light-emitting device was manufactured in the same manner as in Example 1, except that Compound 102 was used (utilized) instead of Compound 101.

Example 3

An organic light-emitting device was manufactured in the same manner as in Example 1, except that Compound 103 was used (utilized) instead of Compound 101.

Example 4

An organic light-emitting device was manufactured in the same manner as in Example 1, except that Compound 104 was used (utilized) instead of Compound 101.

Example 5

An organic light-emitting device was manufactured in the same manner as in Example 1, except that Compound 105 was used (utilized) instead of Compound 101.

Comparative Example 1

An organic light-emitting device was manufactured in the same manner as in Example 1, except that NPB was used (utilized) instead of Compound 101.

Comparative Example 2

An organic light-emitting device was manufactured in the same manner as in Example 1, except that Compound 311 was used (utilized) instead of Compound 101.

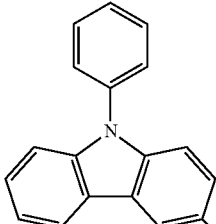

311

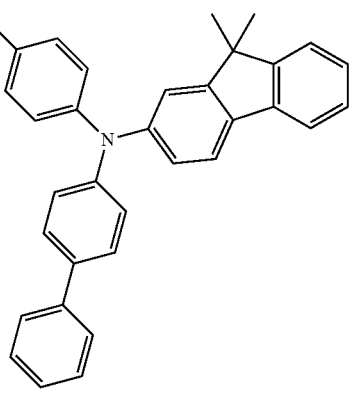

Evaluation Example

Lifespans (at a current density of 9,000 nit) of the organic light-emitting devices of Examples 1 to 5 and Comparative Examples 1 and 2 were evaluated by using (utilizing) a luminance meter (PR650 Spectroscan Source Measurement Unit, available from PhotoResearch, Inc.). The results are shown in Table 1 below:

TABLE 1

| | Auxiliary layer-forming materials | Driving voltage (V) | Efficiency | Lifespan |
|---|---|---|---|---|
| Example 1 | Compound 101 | 3.8 | 1.2 | 1.3 |
| Example 2 | Compound 102 | 3.9 | 1.1 | 1.3 |

TABLE 1-continued

|  | Auxiliary layer-forming materials | Driving voltage (V) | Efficiency | Lifespan |
|---|---|---|---|---|
| Example 3 | Compound 103 | 3.8 | 1.5 | 1.8 |
| Example 4 | Compound 104 | 3.7 | 1.3 | 1.2 |
| Example 5 | Compound 105 | 4.0 | 1.2 | 1.5 |
| Comparative Example 1 | NPB | 4.1 | 1.0 | 1.0 |
| Comparative Example 2 | Compound 311 | 3.9 | 1.1 | 1.1 |

Referring to Table 1 above, it was confirmed that the organic light-emitting devices of Examples 1 to 5 had improved lifespan thereof over the organic light-emitting devices of Comparative Examples 1 and 2. For example, Example 3 utilizing compound 103 has a lifespan which is nearly twice that of Comparative Examples 1 and 2.

As described above, according to the one or more of the above embodiments of the present invention, an organic light-emitting device may have the characteristics of a long lifespan.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting device, comprising:
   a first electrode;
   a second electrode facing the first electrode;
   an emission layer between the first electrode and the second electrode; and
   a hole transport zone between the first electrode and the emission layer and comprising an auxiliary layer,
   wherein the auxiliary layer comprises at least one auxiliary material having a highest occupied molecular orbital (HOMO) energy level (EH) defined by 5.4 eV≤|EH|≤6.1 eV and a triplet energy level ($ET_a$) defined by $|ET_a|≥2.4$ eV, and the emission layer comprises at least one light-emitting material having a triplet energy level ($ET_e$) defined by $|ET_e|≥2.3$ eV.

2. The organic light-emitting device of claim 1, wherein the auxiliary layer comprises at least one auxiliary material represented by Formula 1 below, and the emission layer comprises at least one light-emitting material represented by Formula 2 below:

Formula 1

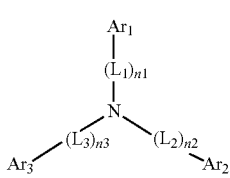

Formula 2

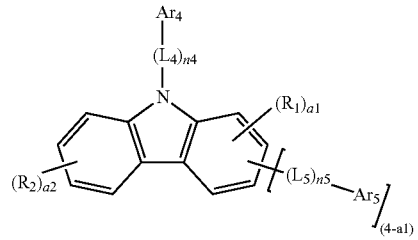

wherein, in Formulae 1 and 2, $Ar_1$ to $Ar_5$ are each independently selected from
i) a $C_6$-$C_{60}$ aryl group and a $C_1$-$C_{60}$ heteroaryl group, and
ii) a $C_6$-$C_{60}$ aryl group and a $C_1$-$C_{60}$ heteroaryl group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

$L_1$ to $L_5$ are each independently selected from
i) a $C_6$-$C_{60}$ arylene group and a $C_1$-$C_{60}$ heteroarylene group, and
ii) a $C_6$-$C_{60}$ arylene group and a $C_1$-$C_{60}$ heteroarylene group, each substituted with at least one substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group;

n1 to n5 are each independently an integer of 0 to 3, and when n1 is 2 or greater, a plurality of $L_1$s are identical to or different from each other, when n2 is 2 or greater, a plurality of $L_2$s are identical to or different from each other, when n3 is 2 or greater, a plurality of $L_3$s are identical to or different from each other, when n4 is 2 or greater, a plurality of $L_4$s are identical to or different from each other, and when n5 is 2 or greater, a plurality of $L_5$s are identical to or different from each other;

$R_1$ and $R_2$ are each independently selected from a hydrogen, a deuterium, a —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$aryloxy group, a substituted or unsubstituted $C_6$-$C_{30}$ arylthio group, and a substituted or unsubstituted $C_2$-$C_{30}$ heteroaryl group; and a1 and a2 are each independently an integer of 0 to 4, and when a1 is 2 or greater, a plurality of $R_1$s are identical to or different from each other, and when a2 is 2 or greater, a plurality of $R_2$s are identical to or different from each other.

3. The organic light-emitting device of claim 1, wherein the emission layer and the auxiliary layer are adjacent to each other.

4. The organic light-emitting device of claim 2, wherein $Ar_1$ to $Ar_5$ are each independently selected from
  i) a phenyl group, a pentalenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzopuranyl group, and a dibenzothienyl group; and
  ii) a phenyl group, a pentalenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzopuranyl group, and a dibenzothienyl group, each substituted with at least one substituent selected from a deuterium, —F, —Cl, —Br, —I, a cyano group, a nitro group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group.

5. The organic light-emitting device of claim 2, wherein $Ar_1$ to $Ar_5$ are each independently selected from
  i) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group;
  ii) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a deuterium, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-buthoxy group;
  iii) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group; and iv) a phenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridinyl group, a pyrazinyl group, a pyrimidinyl group, a pyridazinyl group, an indolyl group, a quinolinyl group, an isoquinolinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group, each substituted with at least one substituent selected from a deuterium, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-buthoxy group.

6. The organic light-emitting device of claim 2, wherein $Ar_1$ to $Ar_3$ are each independently selected from
   i) a phenyl group, a naphthyl group, a fluorenyl group, a pyridinyl group, a pyrimidinyl group, a carbazolyl group, a furanyl group, a benzofuranyl group, a thienyl group, a benzothienyl group, a triazinyl group, a dibenzopuranyl group, and a dibenzothienyl group;
   ii) a phenyl group, a naphthyl group, a fluorenyl group, a pyridinyl group, a pyrimidinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a biphenyl group, a naphthyl group, a pyridinyl group, a pyrimidinyl group, and a triazinyl group; and
   iii) a phenyl group, a naphthyl group, a fluorenyl group, a pyridinyl group, a pyrimidinyl group, a carbazolyl group, a furanyl group, a benzofuranyl group, a thienyl group, a benzothienyl group, a triazinyl group, a dibenzopuranyl group, and a dibenzothienyl group, each substituted with at least one substituent selected from a phenyl group, a naphthyl group, a pyridinyl group, a pyrimidinyl group, and a triazinyl group, each substituted with at least one substituent selected from a deuterium, —F, a cyano group, a nitro group, a methyl group, a tert-butyl group, a methoxy group, and a tert-buthoxy group.

7. The organic light-emitting device of claim 2, wherein $Ar_1$ to $Ar_3$ are each independently selected from
   i) a phenyl group, a naphthyl group, a fluorenyl group, a carbazolyl group, a dibenzopuranyl group, and a dibenzothienyl group; and
   ii) a phenyl group, a naphthyl group, a fluorenyl group, a carbazolyl group, a dibenzopuranyl group, and a dibenzothienyl group, each substituted with at least one substituent selected from a phenyl group, a biphenyl group, a naphthyl group, a pyridinyl group, a pyrimidinyl group, and a triazinyl group.

8. The organic light-emitting device of claim 2, wherein $Ar_4$ and $Ar_5$ are each independently selected from
   i) a phenyl group, a naphthyl group, a fluorenyl group, a pyridinyl group, a pyrimidinyl group, and a triazinyl group;
   ii) a phenyl group, a naphthyl group, a fluorenyl group, a pyridinyl group, a pyrimidinyl group, and a triazinyl group, each substituted with at least one substituent selected from a phenyl group, a naphthyl group, a pyridinyl group, a pyrimidinyl group, and a triazinyl group.

9. The organic light-emitting device of claim 2, wherein $Ar_4$ and $Ar_5$ are each independently selected from
   i) a phenyl group and a naphthyl group; and
   ii) a phenyl group, a naphthyl group, and a triazinyl group, each substituted with at least one substituent selected from a phenyl group, a naphthyl group, and a triazinyl group.

10. The organic light-emitting device of claim 2, wherein $L_1$ to $L_5$ are each independently selected from
    i) a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene; and
    ii) a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene, each substituted with at least one substituent selected from a substituent selected from a deuterium, —F, —Cl, —Br, —I, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group.

11. The organic light-emitting device of claim 2, wherein $L_1$ to $L_5$ are each independently selected from
i) a phenylene group, a naphthylene group, a fluorenylene group, a pyridinylene group, a pyrazinylene group, a pyrimidinylene group, a pyridazinylene group, a carbazolylene group, and a triazolylene group; and
ii) a phenylene group, a naphthylene group, a fluorenylene group, a pyridinylene group, a pyrazinylene group, a pyrimidinylene group, a pyridazinylene group, a carbazolylene group, and a triazolylene group, each substituted with at least one substituent selected from a substituent selected from a phenyl group, a naphthyl group, a pyridinyl group, a pyrimidinyl group, and a triazinyl group.

12. The organic light-emitting device of claim 2, wherein $L_1$ to $L_3$ are each independently selected from
i) a phenylene group, a naphthylene group, and a fluorenylene group; and
ii) a phenylene group, a naphthylene group, and a fluorenylene group, each substituted with at least one substituent selected from a substituent selected from a phenyl group and a naphthyl group.

13. The organic light-emitting device of claim 2, wherein $L_4$ to $L_5$ are each independently selected from
i) a pyridinylene group, a pyrazinylene group, a pyrimidinylene group, a pyridazinylene group, a carbazolylene group, and a triazolylene group; and
ii) a pyridinylene group, a pyrazinylene group, a pyrimidinylene group, a pyridazinylene group, a carbazolylene group, and a triazolylene group, each substituted with at least one substituent selected from a phenyl group, a naphthyl group, a pyridinyl group, a pyrimidinyl group, and a triazinyl group.

14. The organic light-emitting device of claim 2, wherein, $L_5$ is a carbazolylene group.

15. The organic light-emitting device of claim 2, wherein n4 and n5 are each independently 0 or 1.

16. The organic light-emitting device of claim 2, wherein $R_1$ and $R_2$ are each independently selected from a hydrogen, a deuterium, —F, —Cl, —Br, —I, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, a tert-buthoxy group, a phenyl group, a naphthyl group, a pyridinyl group, a pyrimidinyl group, and a triazinyl group.

17. The organic light-emitting device of claim 2, wherein the auxiliary material is selected from any one of Compounds 101 to 119, and the light-emitting material is selected from any one of compounds 210 to 232:

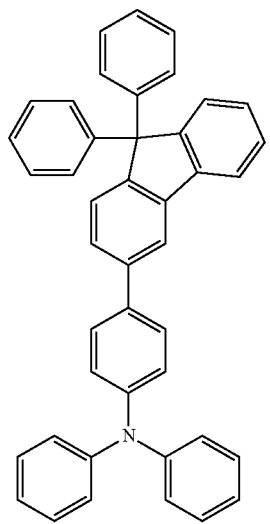

101

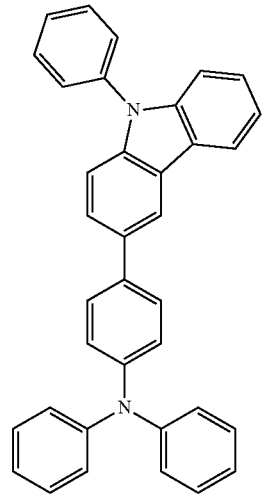

102

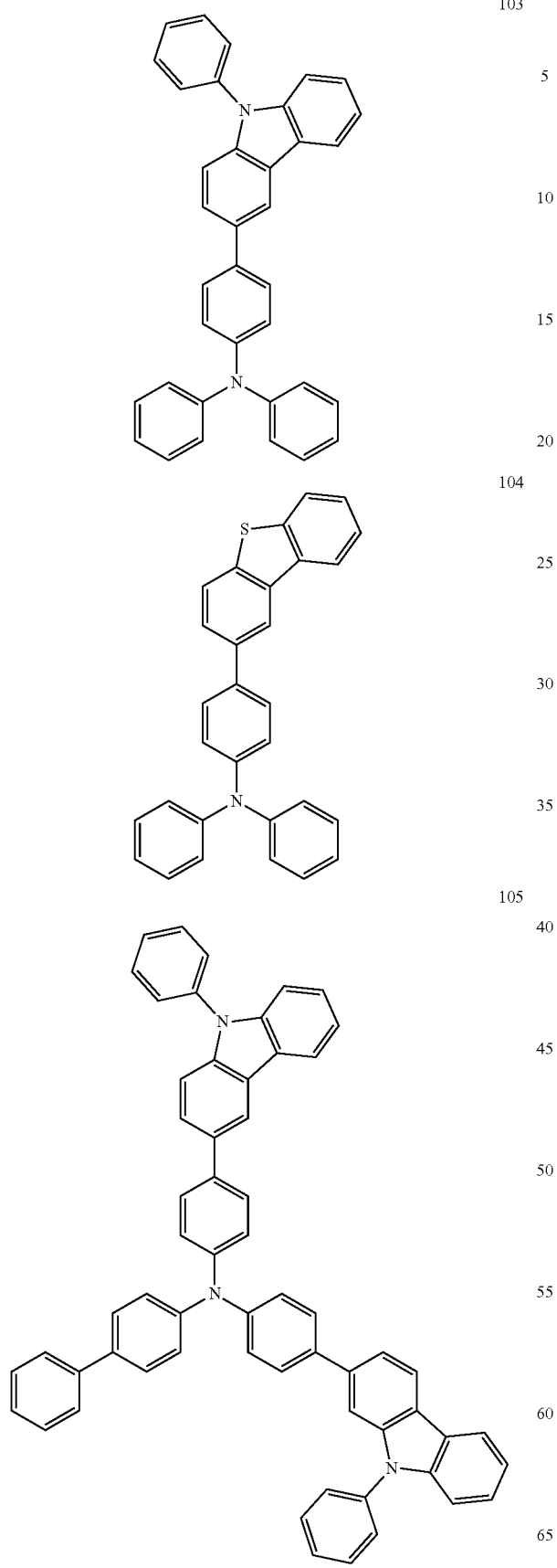
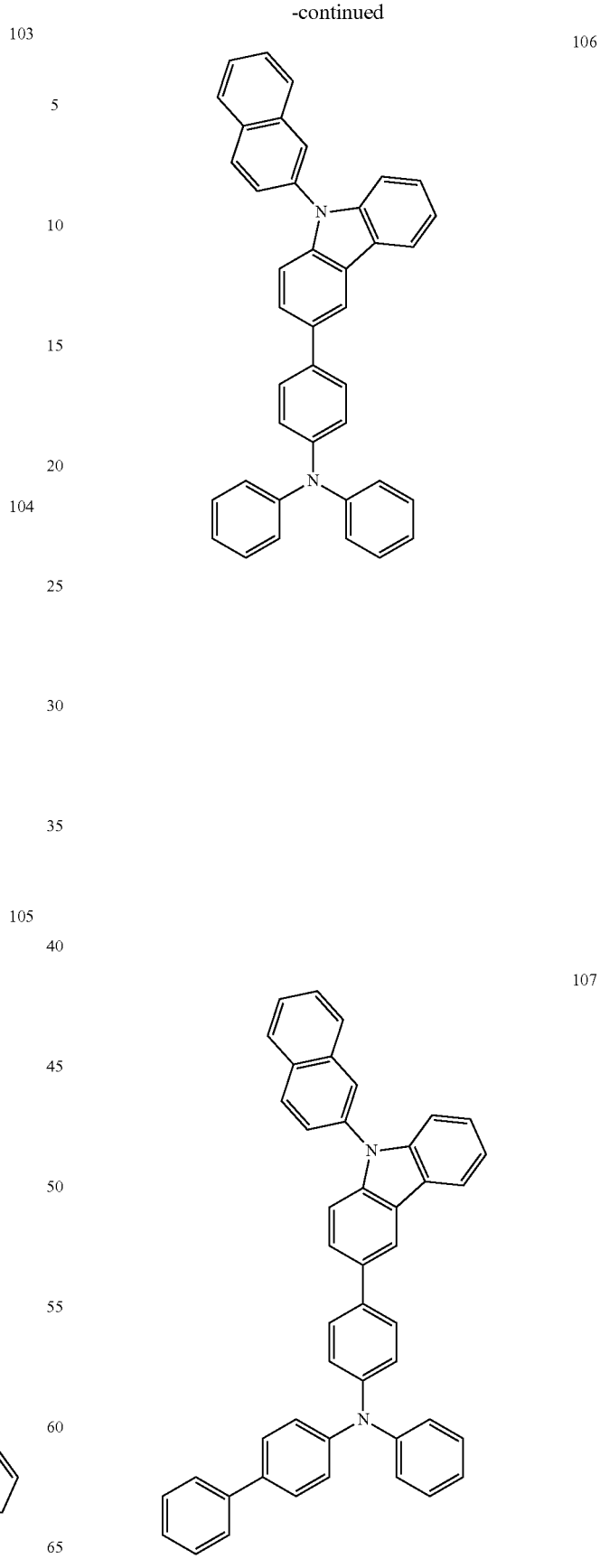

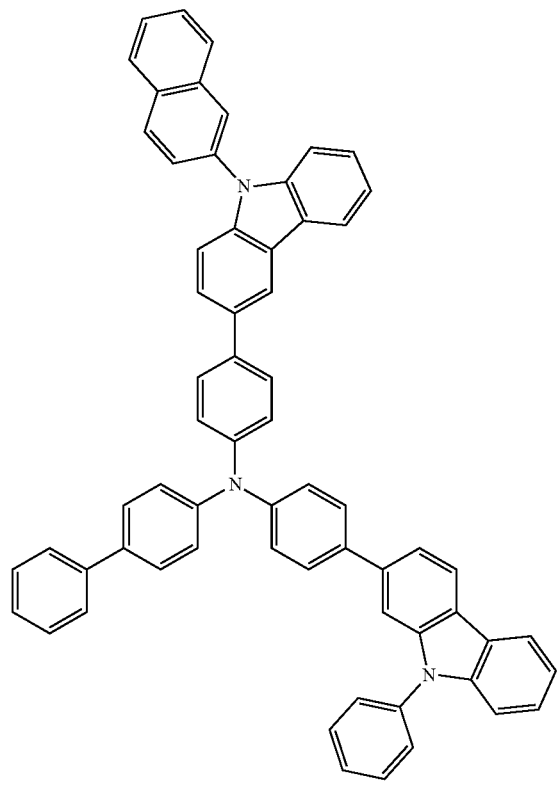
109
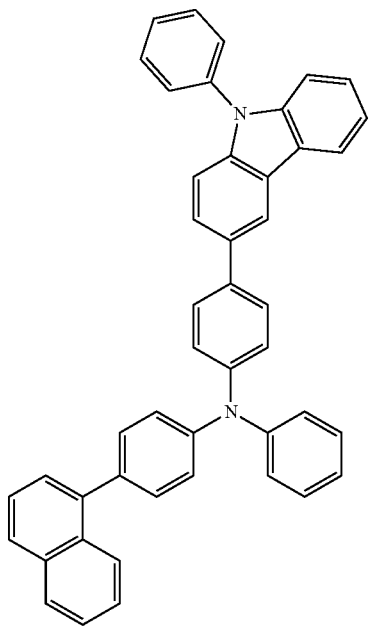
111
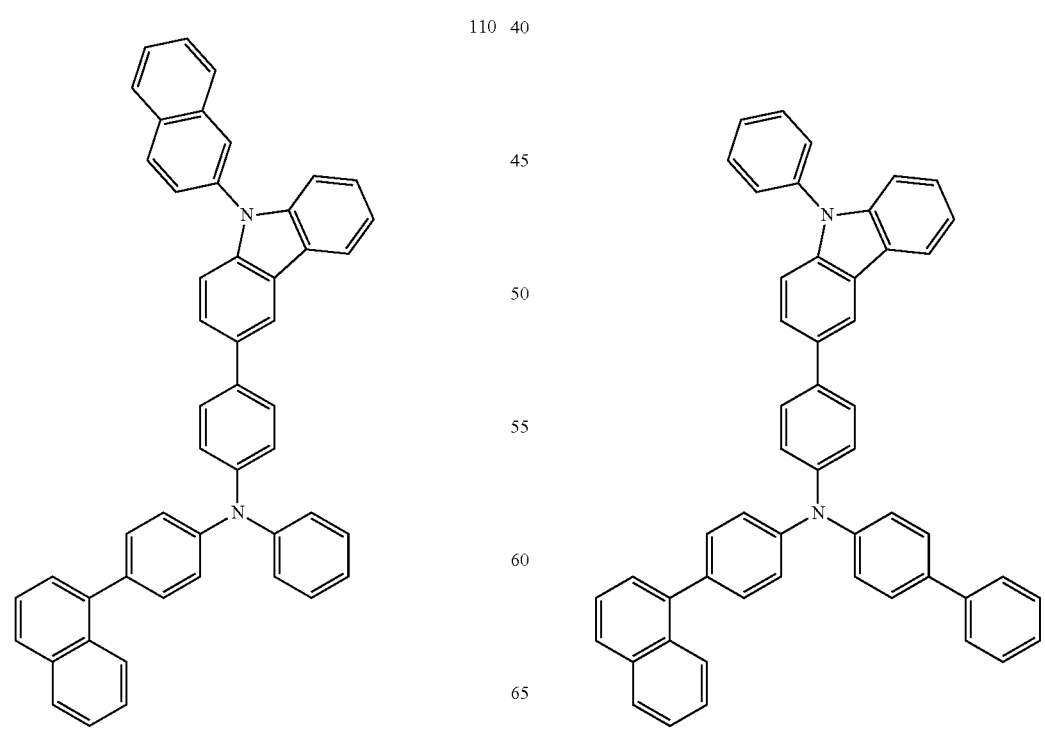
110  112

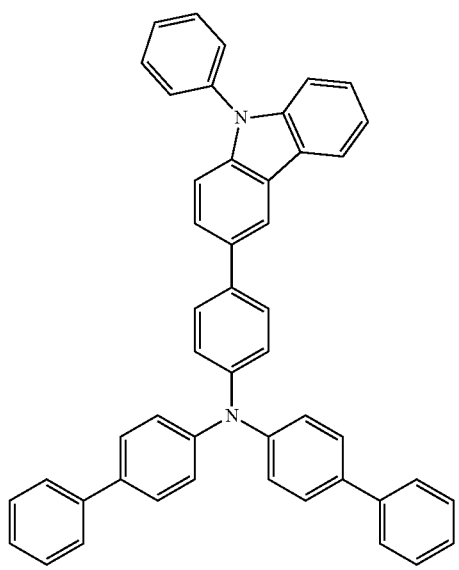
113
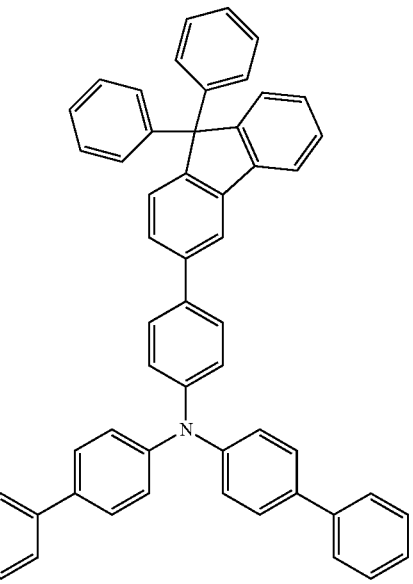
109
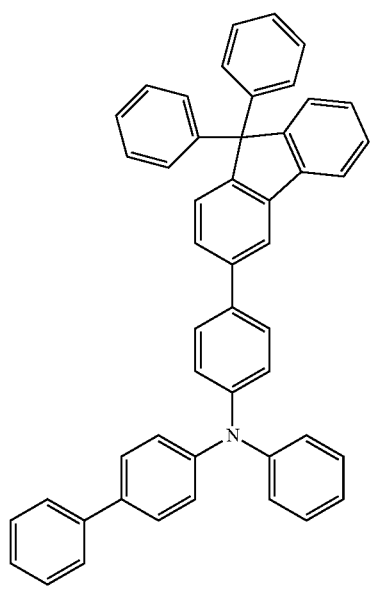
107
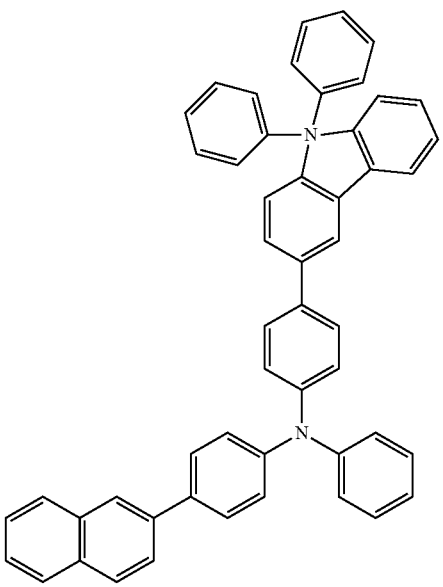
110

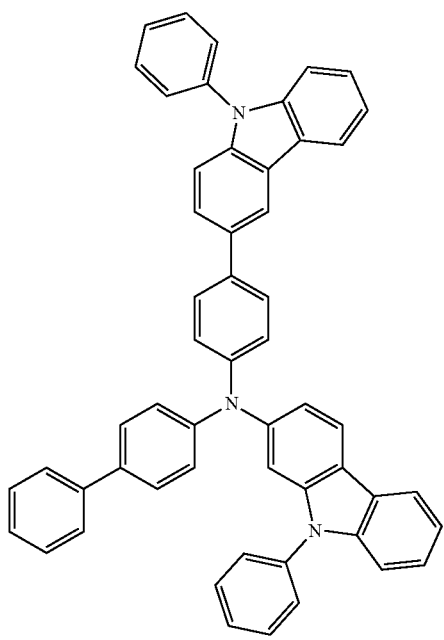
111
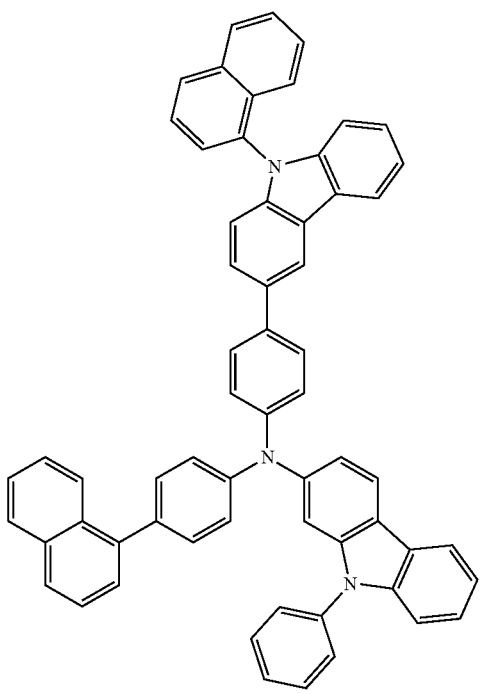
113
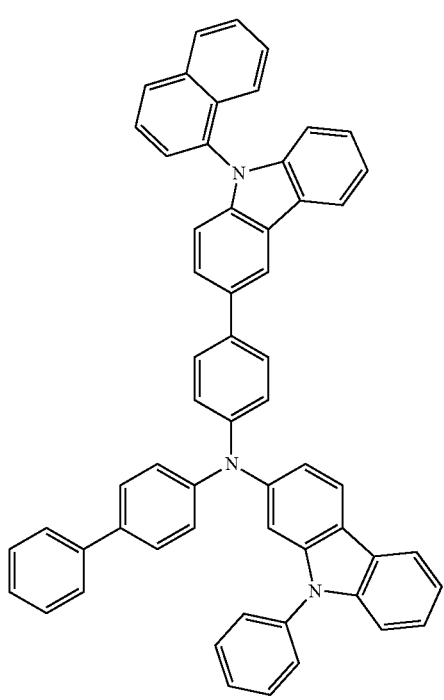
112
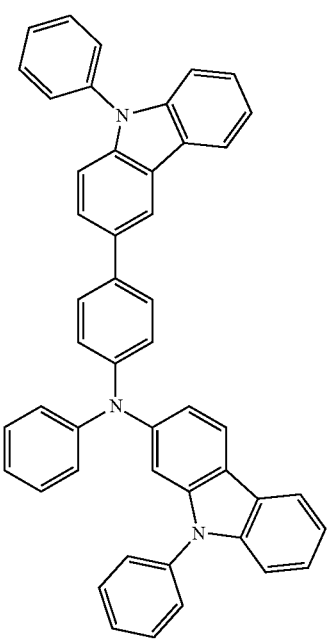
114

115
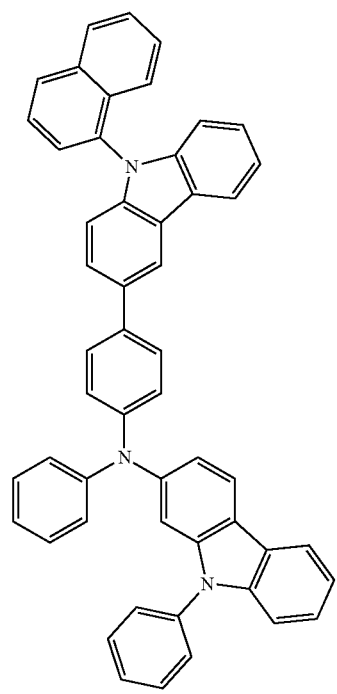
116
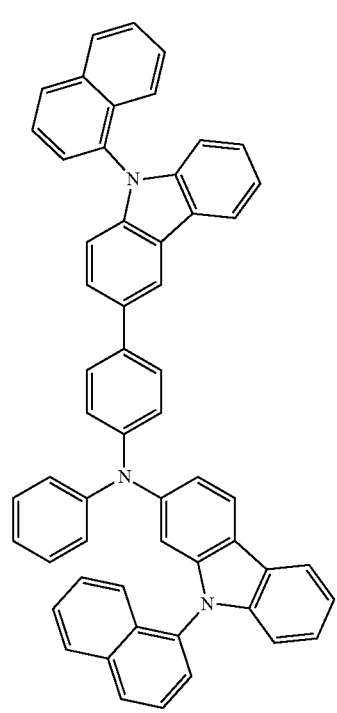
117
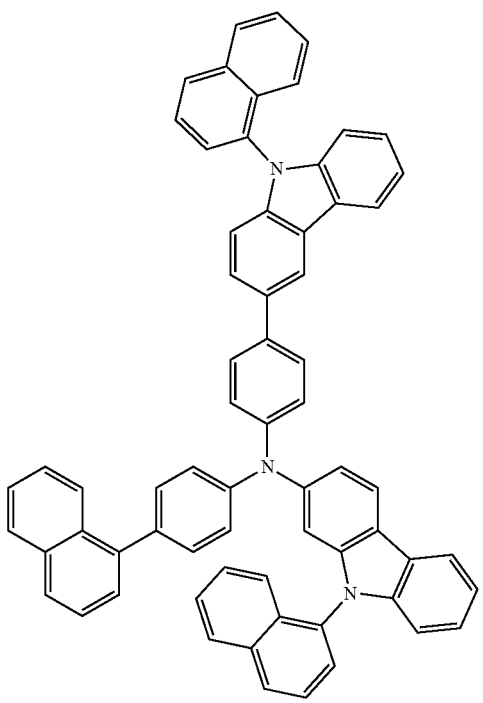
118
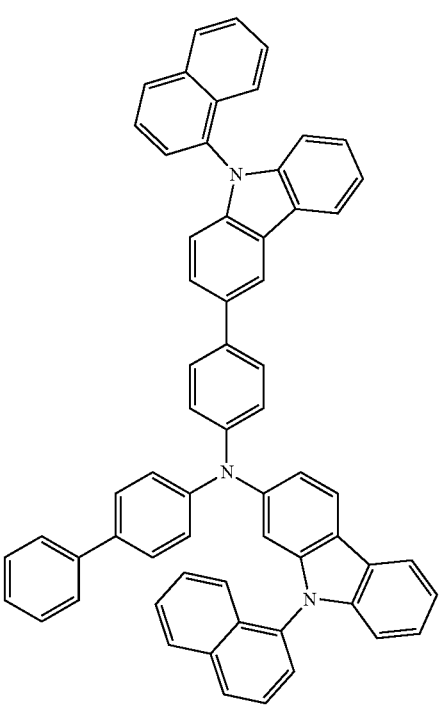

119
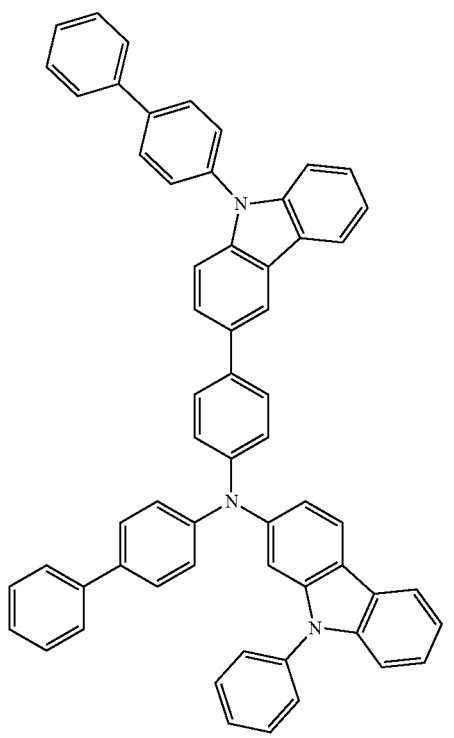
211
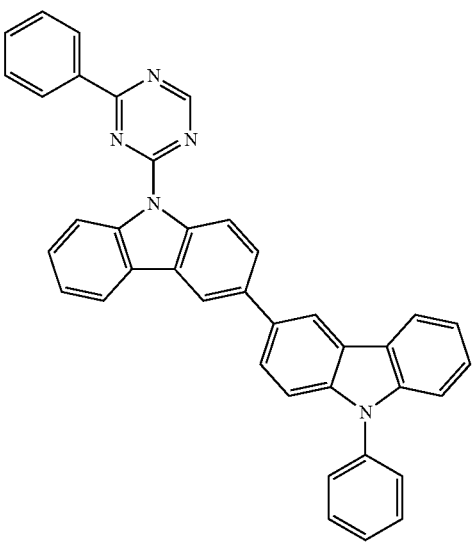
212
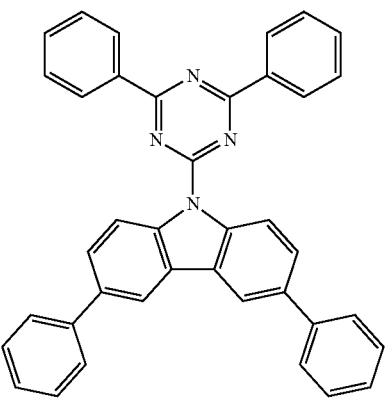
210
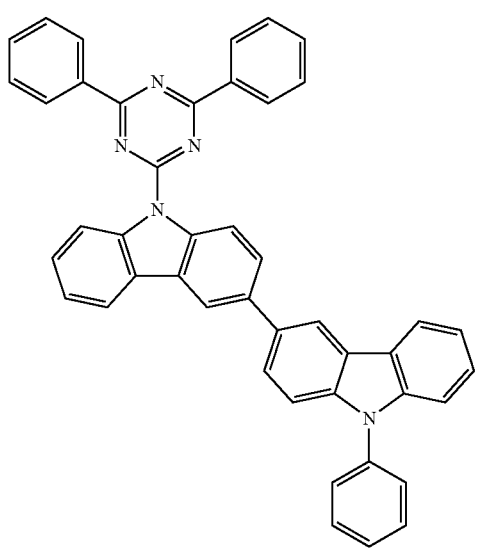
213

214
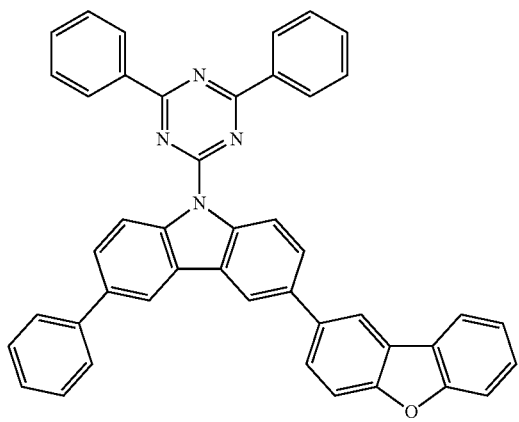
215
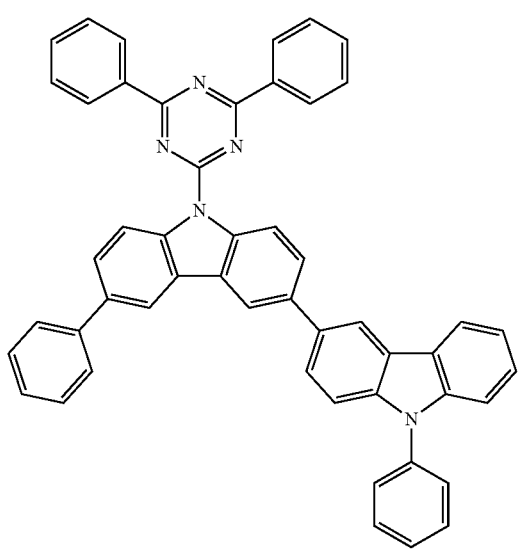
216
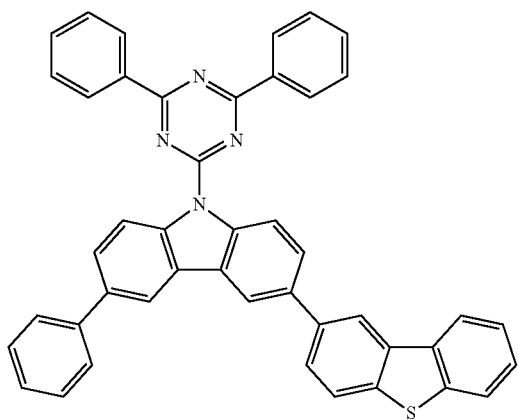
217
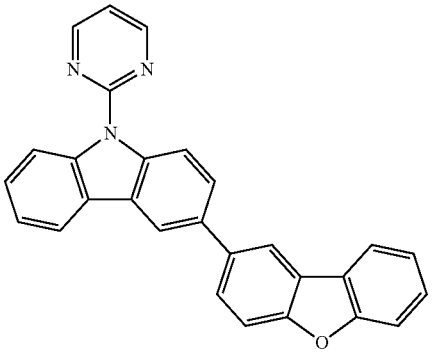
218
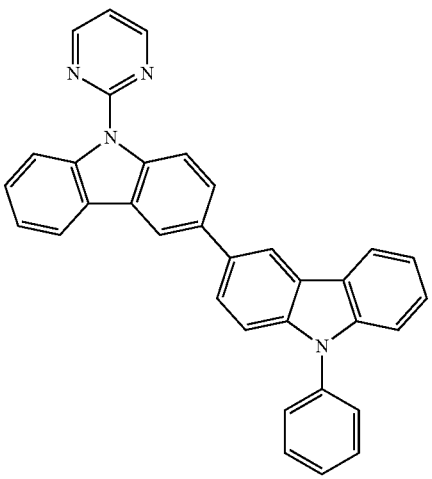
219
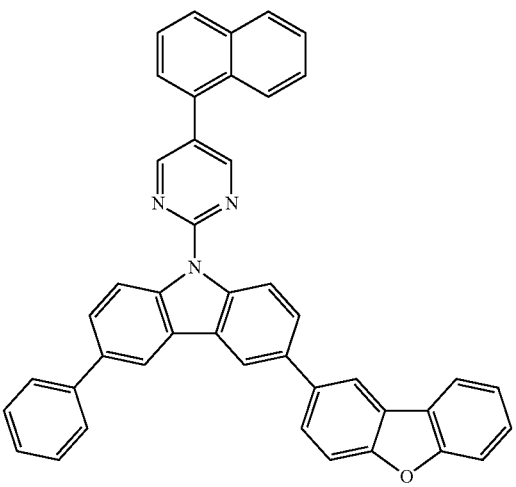

93
-continued
220
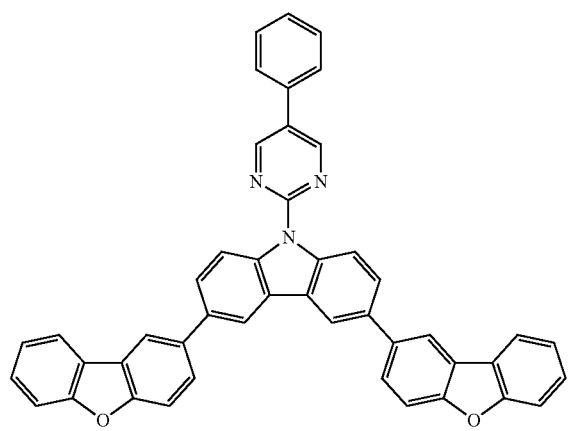
221
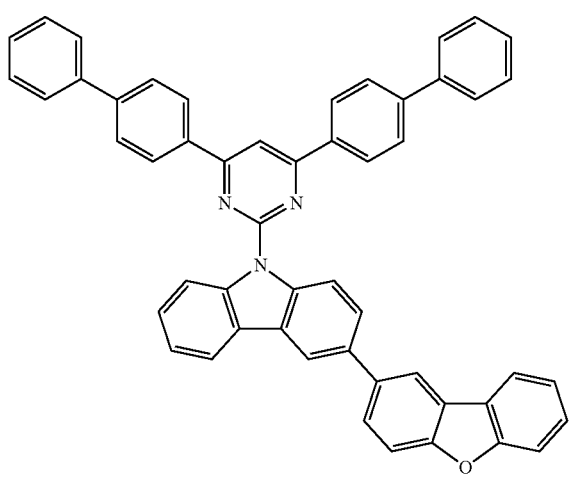
222
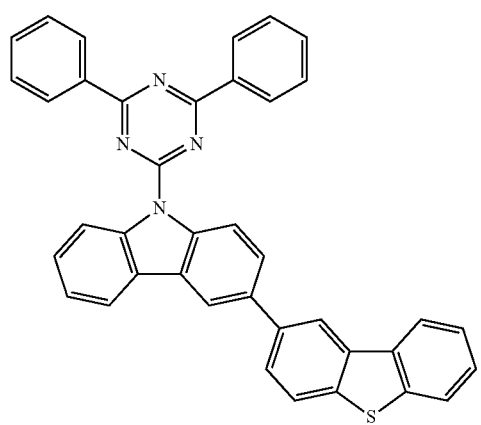
94
-continued
223
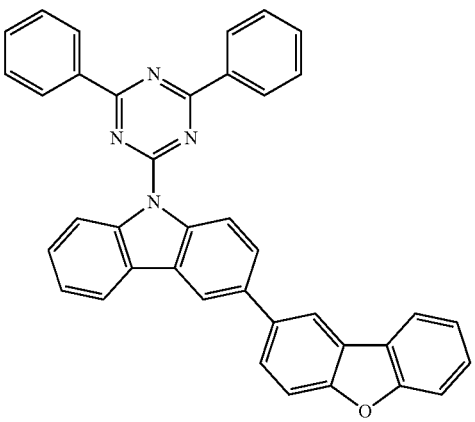
224
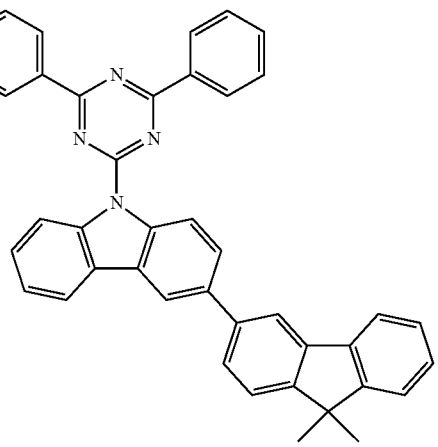
225
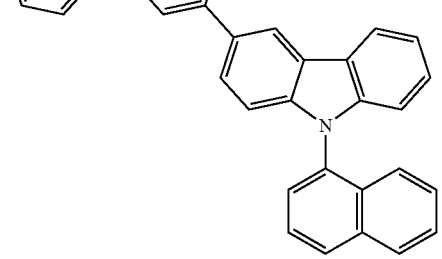

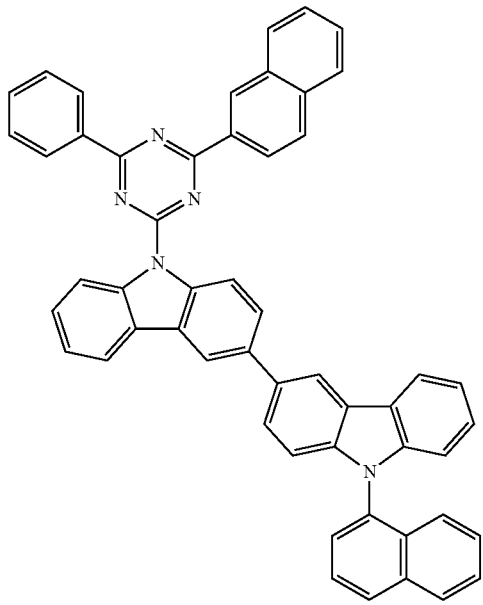
226
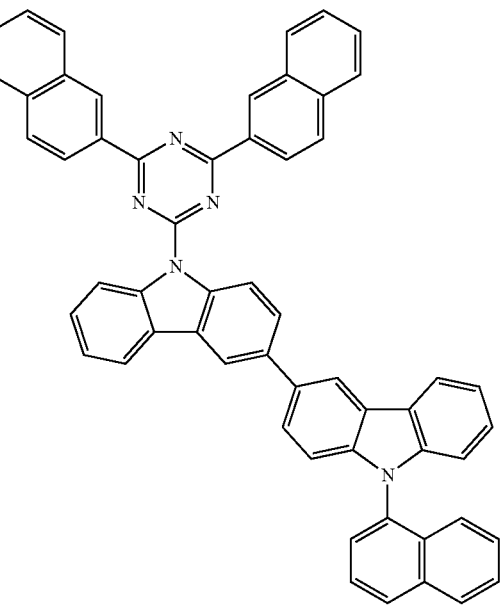
228
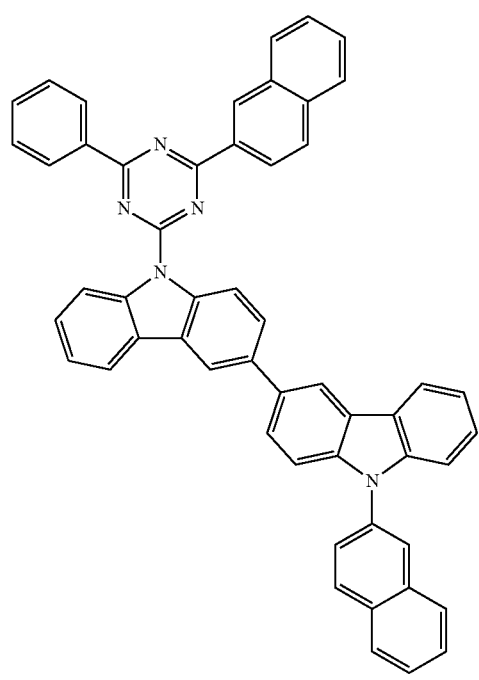
227
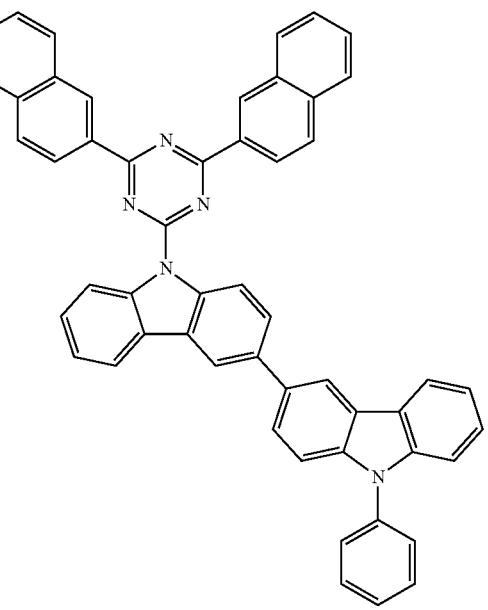
229

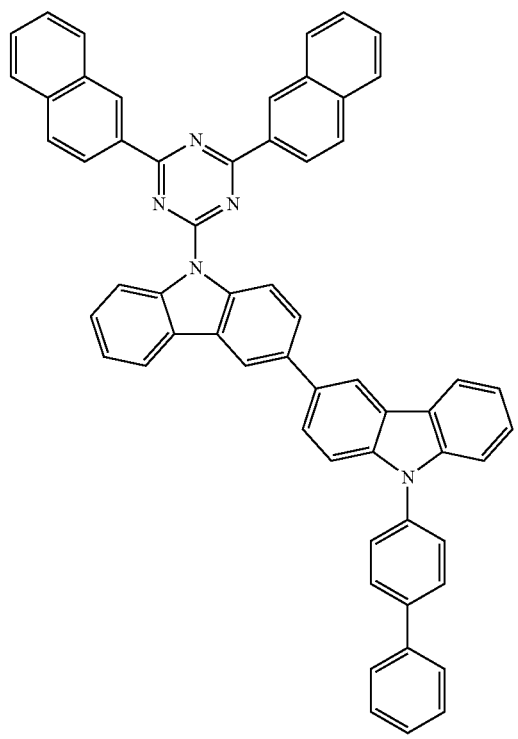
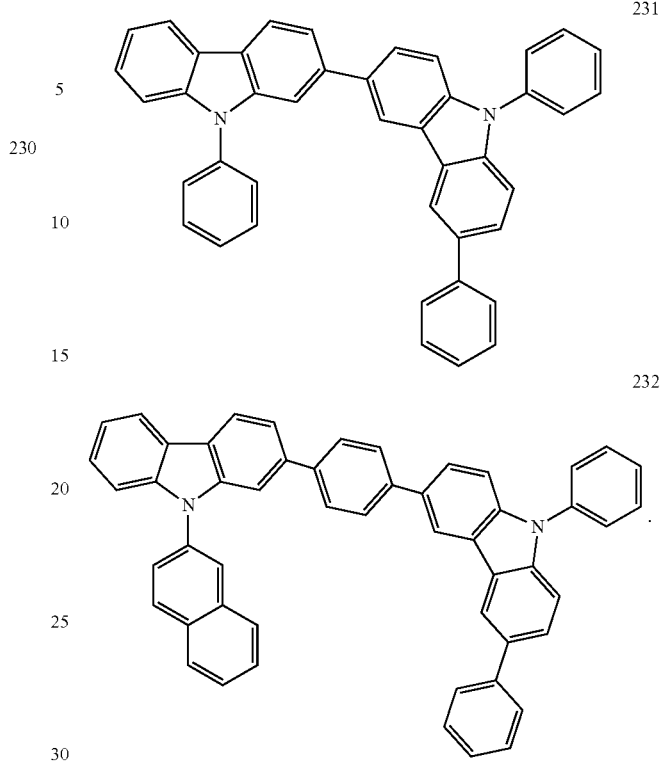
18. The organic light-emitting device of claim 2, wherein the emission layer and the auxiliary layer are adjacent to each other.
19. The organic light-emitting device of claim 1, wherein the light-emitting material acts as a host, and the emission layer further comprises a phosphorescent dopant.
* * * * *